(12) United States Patent
Loch et al.

(10) Patent No.: US 11,283,204 B1
(45) Date of Patent: Mar. 22, 2022

(54) SYSTEMS AND METHODS FOR PROVIDING A COMPOSITE CONNECTOR FOR HIGH SPEED INTERCONNECT SYSTEMS

(71) Applicant: Eagle Technology, LLC, Melbourne, FL (US)

(72) Inventors: Dale Loch, Melbourne Beach, FL (US); Michael T. DeRoy, Melbourne, FL (US)

(73) Assignee: Eagle Technology, LLC, Melbourne, FL (US)

( * ) Notice: Subject to any disclaimer, the term of this patent is extended or adjusted under 35 U.S.C. 154(b) by 0 days.

(21) Appl. No.: 16/952,961

(22) Filed: Nov. 19, 2020

(51) Int. Cl.
H01R 12/00 (2006.01)
H01R 12/52 (2011.01)
H01R 43/02 (2006.01)

(52) U.S. Cl.
CPC ......... H01R 12/52 (2013.01); H01R 43/0256 (2013.01)

(58) Field of Classification Search
CPC ...... H01R 12/51; H01R 12/52; H01R 12/523; H01R 12/526; H01R 43/02; H01R 43/0256
USPC ...................................................... 439/55, 65
See application file for complete search history.

(56) References Cited

U.S. PATENT DOCUMENTS

| | | |
|---|---|---|
| 4,290,195 A | 9/1981 | Rippere |
| 6,076,726 A | 6/2000 | Hoffmeyer et al. |
| 6,917,525 B2 | 7/2005 | Mok et al. |
| 6,981,320 B2 | 1/2006 | Ho et al. |
| 7,281,321 B2 | 10/2007 | Kim et al. |
| 7,342,803 B2 | 3/2008 | Inagaki et al. |
| 7,908,744 B2 | 3/2011 | Hsu et al. |
| 9,679,841 B2 | 6/2017 | Jomaa et al. |
| 9,761,972 B2 | 9/2017 | Beucler et al. |
| 10,096,915 B2 | 10/2018 | McKenney et al. |
| 10,417,167 B2 | 9/2019 | Buckland et al. |
| 10,517,167 B1 | 12/2019 | DeRoy et al. |
| 2004/0022330 A1 | 2/2004 | Shiozawa et al. |
| 2004/0115968 A1 | 6/2004 | Cohen |
| 2004/0223309 A1 | 11/2004 | Haemer et al. |
| 2004/0256731 A1 | 12/2004 | Mao et al. |
| 2007/0125574 A1 | 6/2007 | Kim et al. |
| 2009/0029031 A1 | 1/2009 | Lowrey |
| 2009/0290316 A1 | 11/2009 | Kariya |

(Continued)

FOREIGN PATENT DOCUMENTS

JP 20000208918 A 7/2000

OTHER PUBLICATIONS

Herbert Endres, Molex, Solder Charge—An Alternative to BGA, SMT7, Dec. 31, 1969.

*Primary Examiner* — Khiem M Nguyen
(74) *Attorney, Agent, or Firm* — Fox Rothschild, LLP; Robert Sacco; Carol Thorstad Forsyth

(57) ABSTRACT

Systems and methods for simultaneously coupling a plurality of high speed electrical connectors to a Printed Wiring Board ("PWB"). The methods comprise: obtaining a composite electrical connector comprising the plurality of high speed electrical connectors which are serially arranged in a side-by-side manner and coupled to each other; automatedly engaging a smooth surface of the composite electrical connector; placing the composite electrical connector on the PWB so that pins of the plurality of high speed electrical connectors are concurrently inserted into vias formed in the PWB; and coupling the composite electrical connector to the PWB by soldering the pins in the vias.

26 Claims, 25 Drawing Sheets

(56) References Cited

U.S. PATENT DOCUMENTS

| | | |
|---|---|---|
| 2013/0230272 A1 | 9/2013 | Raj et al. |
| 2014/0252638 A1 | 9/2014 | Pandey et al. |
| 2016/0036532 A1 | 2/2016 | Noguchi |
| 2016/0365322 A1 | 12/2016 | Lin et al. |
| 2017/0030340 A1 | 2/2017 | Knoeller et al. |
| 2017/0047686 A1 | 2/2017 | Wig |
| 2017/0149154 A1 | 5/2017 | McKenney et al. |
| 2017/0149155 A1 | 5/2017 | McKenney et al. |
| 2017/0244184 A1 | 8/2017 | McKenney et al. |
| 2017/0303401 A1 | 10/2017 | Rathburn |

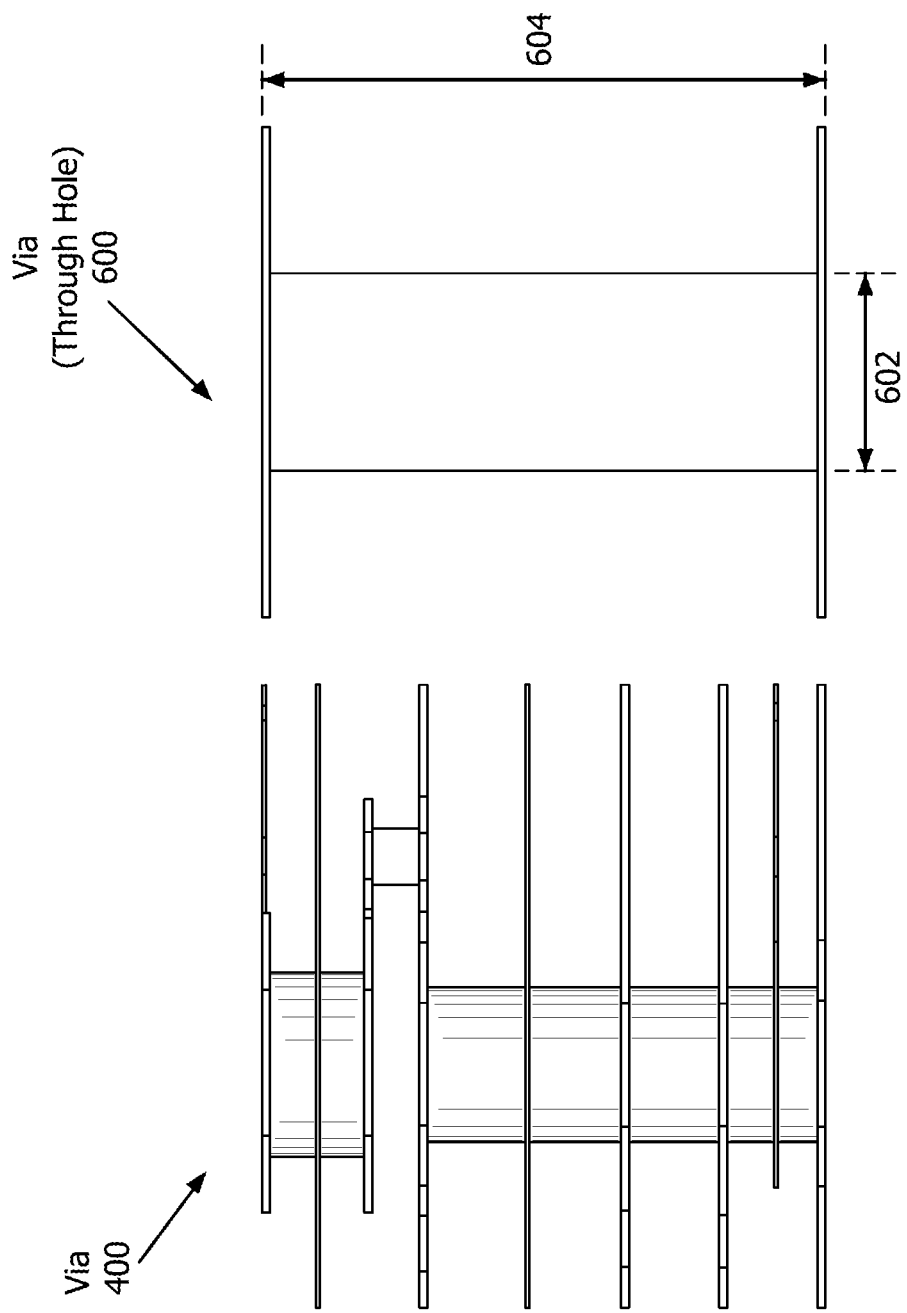

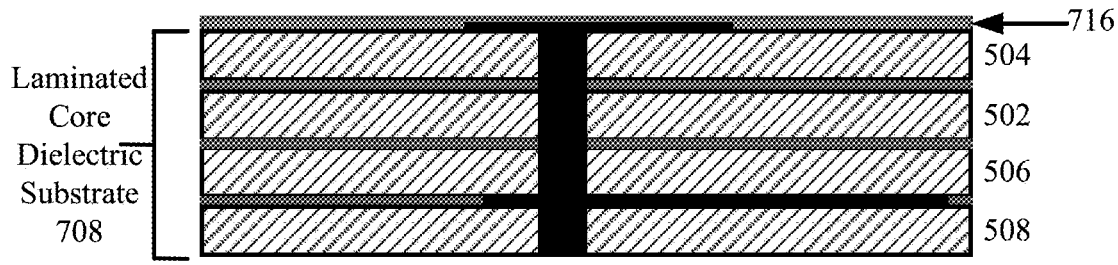
FIG. 7L
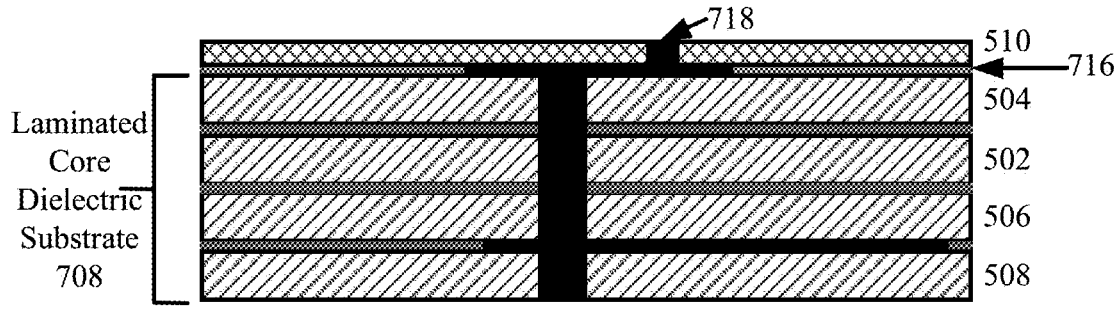
FIG. 7M
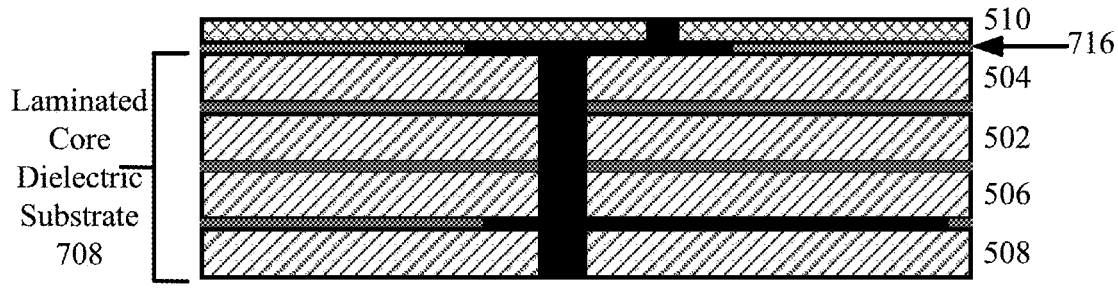
FIG. 7N
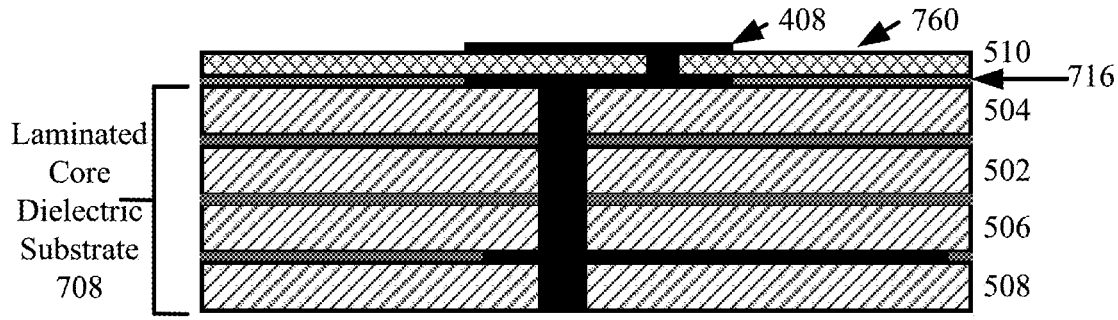
FIG. 7O

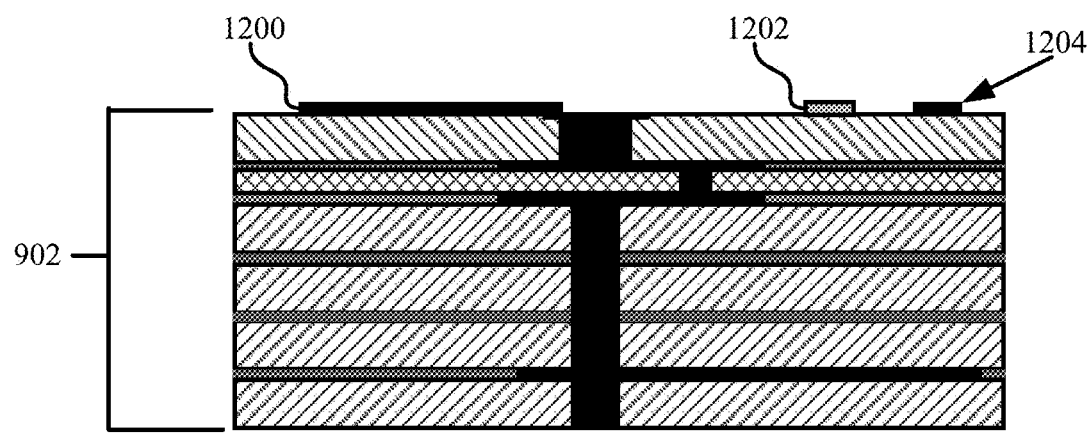
FIG. 12
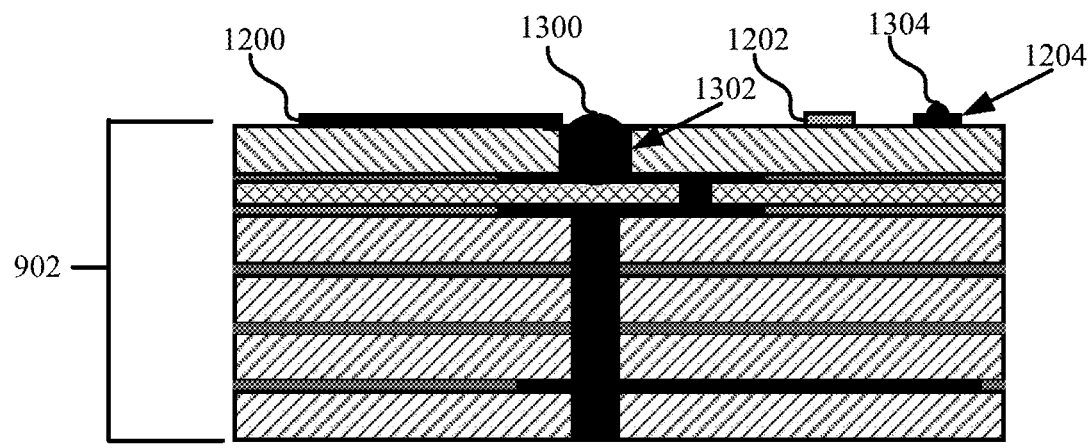
FIG. 13
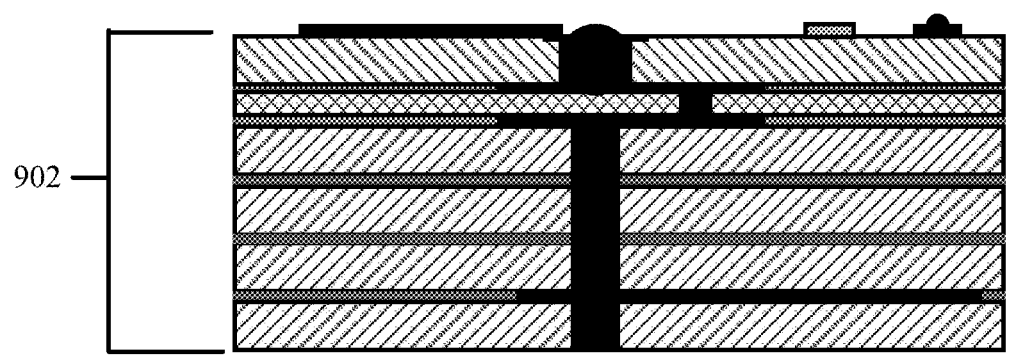
FIG. 14

SYSTEMS AND METHODS FOR PROVIDING A COMPOSITE CONNECTOR FOR HIGH SPEED INTERCONNECT SYSTEMS

BACKGROUND

Statement of the Technical Field

This disclosure relates generally to electronic interconnect systems. More particularly, this disclosure concerns systems and methods for providing a composite connector for high speed interconnect systems.

Description of the Related Art

VPX is an ANSI standard that provides VMEbus-based systems with support for switched fabrics over a high speed connector. Switched fabrics technology supports the implementation of multiprocessing systems that require the fastest possible communications between processors. The high speed connectors are often referred to in the art as VPX connectors (e.g., the MultiGig RT2 and/or RT-3R connector(s) available from TE Connectivity of Switzerland). VPX connectors are rated typically to support up to 16 Giga bits per second ("Gbps").

SUMMARY

This document concerns systems and methods for simultaneously coupling a plurality of high speed electrical connectors to a Printed Wiring Board ("PWB"). The methods comprising: obtaining a composite electrical connector comprising the plurality of high speed electrical connectors which are serially arranged in a side-by-side manner and coupled to each other; automatedly engaging a smooth surface of the composite electrical connector; placing the composite electrical connector on the PWB so that pins of the plurality of high speed electrical connectors are concurrently inserted into vias (e.g., blind vias) formed in the PWB; and coupling the composite electrical connector to the PWB by soldering the pins in the vias.

In some scenarios, the high speed electrical connectors are coupled to each other with a weld, an adhesive or tape. Additionally or alternatively, at least one high speed electrical connector comprises protrusion(s) inserted into aperture(s) formed in an adjacent high speed electrical connector.

In those or other scenarios, the composite electrical connector comprises a cover that has a planar smooth surface and couples the high speed electrical connectors to each other. The cover may extend an entire collective length and width of the plurality of high speed electrical connectors. Alternatively, the cover may have at least one of (i) a length less than a collective length of the plurality of high speed electrical connectors and (ii) a width less than the collective width of the plurality of high speed electrical connectors.

In those or other scenarios, the composite electrical connector comprises: a band encompassing the high speed electrical connectors; a bar at least partially inserted into each connector of the high speed electrical connectors; a cap coupled to the high speed electrical connectors and configured to maintain the high speed electrical connectors in a side-by-side arrangement; and/or a planar element that covers a rough, coarse, textured or uneven top surface of the high speed electrical connector(s).

In those or other scenarios, at least two connectors of the high speed electrical connectors have a different number of pins. The pins may have lengths between 25-30 mils. Each via may be electrically connected to a buried via of the PWB that has a central axis spatially offset from a central axis of the via.

The present document also concerns a composite electrical connector. The composite electrical connector comprises: a plurality of high speed electrical connectors which are serially arranged in a side-by-side manner; a coupling element coupling the plurality of high speed electrical connectors to each other; and a smooth surface configured to facilitate an automated placement of the composite electrical connector on a PWB so that pins of the plurality of high speed electrical connectors are concurrently inserted into vias formed in the PWB.

In some scenarios, the coupling element comprises a weld, an adhesive and/or tape. Alternatively or additionally, the coupling element comprises at least one protrusion (i) extending from a sidewall of at least one connector of the high speed electrical connectors and (ii) inserted into at least one aperture formed in a sidewall of an adjacent connector of the high speed electrical connectors.

In those or other scenarios, the coupling element comprises a cover. The cover may extend an entire collective length and width of the high speed electrical connectors. Alternatively, the cover has (i) a length less than a collective length of the high speed electrical connectors and/or (ii) a width less than the collective width of the high speed electrical connectors.

In those or other scenarios, the coupling element comprises: a band encompassing the high speed electrical connectors; a bar at least partially inserted into each high speed electrical connector; a cap configured to maintain the high speed electrical connectors in a side-by-side arrangement; and/or a planar element that covers a rough, coarse, textured or uneven top surface of at least one high speed electrical connector.

The present document further concerns a system. The system comprises: a PWB having a substrate in which a plurality of vias are formed; and a composite electrical connector coupled to the PWB. The composite electrical connector comprises: a plurality of high speed electrical connectors which are arranged in a side-by-side manner; a coupling element configured to couple the plurality of high speed electrical connectors to each other; and a smooth surface configured to facilitate an automated placement of the composite electrical connector on the PWB. Pins of the high speed electrical connectors are concurrently inserted into the vias of the PWB during the automated placement of the composite electrical connector on the PWB. The coupling element may comprise at least one of a weld, an adhesive, a piece of tape, a protrusion, a cover, a band, a bar, and a cap. At least two high speed electrical connectors may have a different number of pins.

BRIEF DESCRIPTION OF THE DRAWINGS

This disclosure is facilitated by reference to the following drawing figures, in which like numerals represent like items throughout the figures.

FIG. 6 is an illustration that is useful for understanding the differences between the present solution and a conventional through hole via.

FIGS. 12-17 provides illustrations that are useful for understanding how composite electrical connector(s) and/or other electronic component(s) are coupled to a PWB.

DETAILED DESCRIPTION

Figure 1:
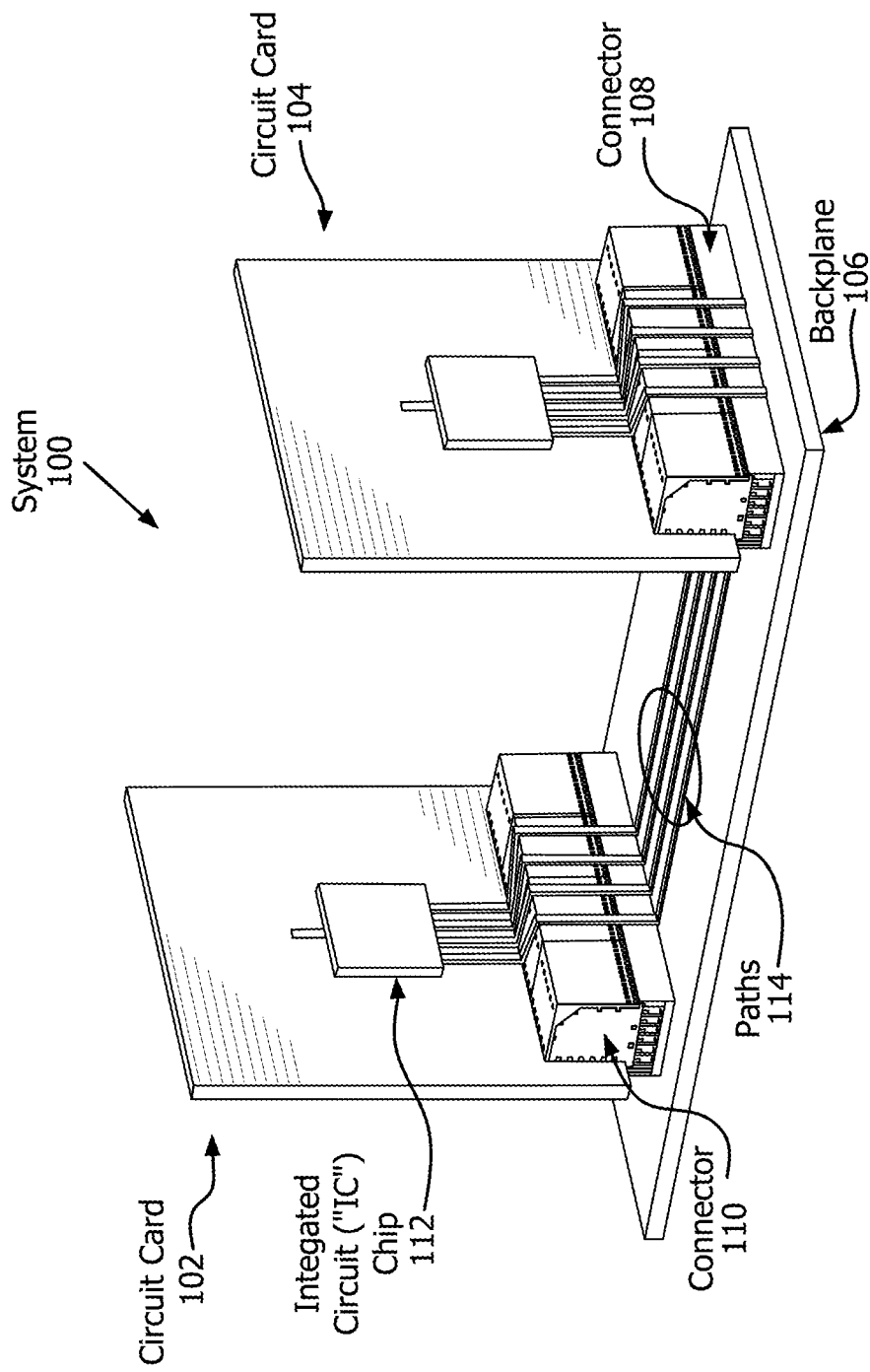
FIG. 1 is an illustration of an illustrative system.

It will be readily understood that the solution described herein and illustrated in the appended figures could involve a wide variety of different configurations. Thus, the following more detailed description, as represented in the figures, is not intended to limit the scope of the present disclosure but is merely representative of certain implementations in various different scenarios. While the various aspects are presented in the drawings, the drawings are not necessarily drawn to scale unless specifically indicated.

Reference throughout this specification to features, advantages, or similar language does not imply that all of the features and advantages that may be realized should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

The current generation of industry standard VPX connectors are challenged to support a 25 Giga bits per second ("GBPS") data rate at Bit Error Rates ("BER") of 1E-15 or better when trying to communicate from a 25 Gbps transceiver chip on the first daughter card, through a VPX connector, across 12 inches of backplane, through another VPX connector to a second transceiver chip on a second daughter card. Accordingly, the present solution provides a connector that is designed to address this drawback of conventional VPX connectors. The connector is also compliant to and can be used for avionics applications. As such, the connector will survive avionics environmental exposures, as well as other harsh environments associated with military hardware applications.

Analysis shows a limitation of conventional VPX connectors (e.g., VITA46 connectors) to 25 Gbps operation is the crosstalk occurring in the via field directly underneath the VPX connectors on both the circuit (or daughter) cards and the backplane. The present solution involves a novel refinement to the VPX standard connector pins, and a novel Printed Wiring Board ("PWB") structure that uses Double Transition ("DT") vias which reduce cross talk in the via field directly underneath the VPX connector, yet does not reduce the VPX connectors ability to survive the environment.

Referring now to FIG. 1, there is provided an illustration of an illustrative system 100 that is useful for understanding the present solution. System 100 is designed to test circuit cards for performance in accordance with IEEE standards and by emulating the final system in which the circuit cards will be disposed. In this regard, system 100 comprises circuit cards 102, 104 and a backplane 106. A rack (not shown in FIG. 1) mechanically supports the circuit cards and backplanes in their relative vertical and horizontal positions. Such a rack is well known in the art, and will not be described herein.

Integrated Circuit ("IC") chips 112 of the circuit cards 102, 104 are electrically connected to each other through connectors 108, 110 and traces (notionally shown) formed in the backplane 106. Paths 114 are provided to show these electrical connections between the IC chips 112 through components 106, 108, 110. In some scenarios, the IC chips 112 include communications technology, such as transceivers. Transceivers are well known in the art, and therefore will not be described herein. Any known or to be known transceiver can be used herein without limitation. During operations, data is communicated between IC chips 112 at a relatively high speed of a 25 Gbps data rate with a BER of 1E-15 or better. This high speed data communication is facilitated by the present solution including novel connectors 108, 110 and via designs which will become more evident as the discussion progresses. The present solution is compliant with the VITA base standard defining physical features that enable high speed communication in a system.

Figure 2:
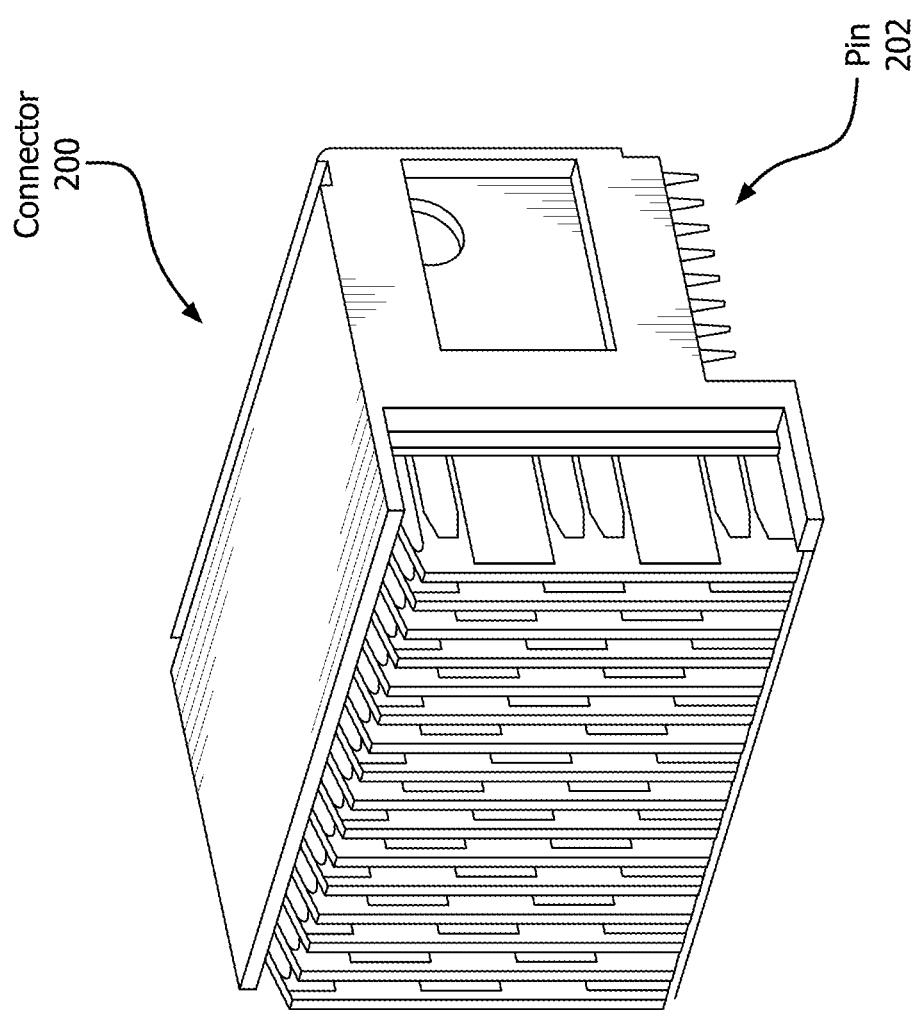
FIG. 2 is an image of an illustrative connector.

An illustration of a conventional VPX connector 200 is provided in FIG. 2. VPX connector 200 is designed for press-fit applications and is rated to support up to 16 Giga bits per second ("Gbps"). As shown in FIG. 2, the VPX connector 200 comprises a plurality of elongate pins 202. The length of the pins 202 are selected such that the pins respectively pass through vias formed in the backplane. These vias are through hole type vias 600 as shown in FIG. 6. Accordingly, the elongate lengths of the pins 202 are typically between 60-90 mils.

The connectors 108, 110 of FIG. 1 comprise a modified version of VPX connector 200. In this regard, it should be understood that the pins of connectors 108, 110 have smaller elongate lengths than that of pins 202. As noted above, the elongate lengths of conventional pins 202 are between 60-90 mils. In contrast, the elongate lengths of the pins of connectors 108, 110 are between 25-30 mils in some scenarios. The short pins allow the connectors 108, 110 to be mounted to the circuit cards 102, 104 by way of surface mounts or solder interfaces. This difference is important since it facilitates a reduction in cross talk interferences within the connectors 108, 110 and the circuit cards 102, 104. In this regard, it should be understood that the longer the pins the greater the cross talk interference. Cross talk is minimized by decreasing the length of the pins.

Additionally, to establish the 25 Gbps performance, a novel interconnect and layering (or junction) configuration is provided with the PWB 106, 108, 110 to minimize the cross talk and electrical performance within the PWB. This novel interconnect and layering (or junction) configuration will become more evident as the discussion progresses.

Figure 3:
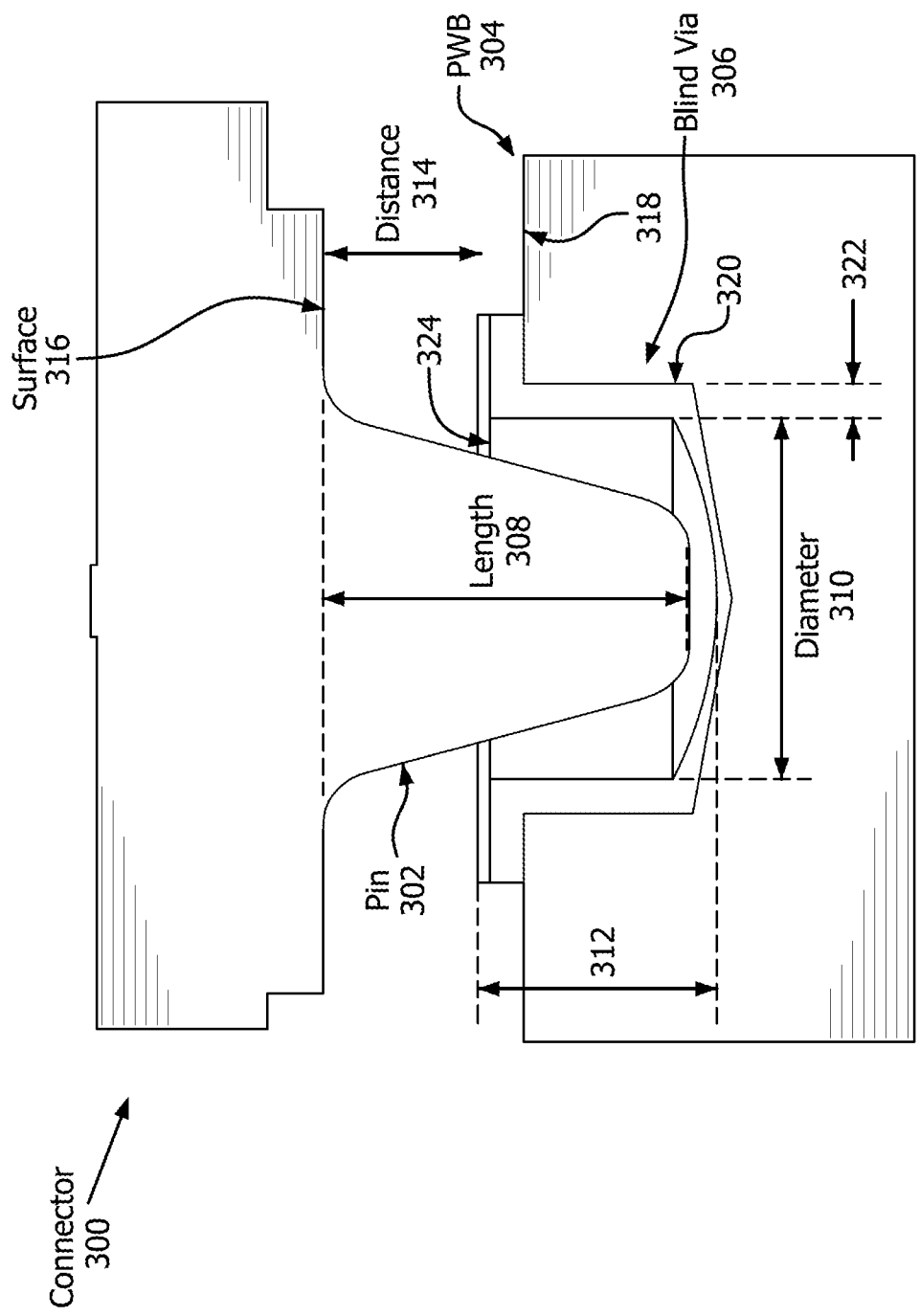
FIG. 3 is an illustration that is useful for understanding a connector and PWB architecture in accordance with the present solution.

Referring now to FIG. 3, there is provided a cross-sectional view that is useful for understanding an interconnect interface between pin(s) 302 of a connector 300 and a PWB 304 in accordance with the present solution. Connectors 108, 110 of FIG. 1 can be the same as or similar to connector 300, and/or the boards 102, 104, 106 of FIG. 1 can be the same as or similar to PWB 304. As such, the discussion of connector 300 and PWB 304 is sufficient for understanding components 102-110 of FIG. 1.

Although connector 300 is shown as having a single pin 302, the present solution is not limited in this regard. Connector 300 can have any number of pins selected in accordance with a particular application. The pins can have an array format defined by rows and columns, which may be equally spaced apart.

Pin 302 is soldered to blind via 306. The solder is not shown in FIG. 3 for purposes of simplifying the illustration. Pin 302 has a length and the blind via 306 has a shape/size which are selected to ensure that (a) a certain distance 314 is provided between the connector's surface 316 and the PWB's surface 318 and (b) a satisfactory solder based connection is made between the connector 300 and PWB 304. In some scenarios, the pin's length 308 is between 25-30 mils. The distance 314 between the surface's 316, 318 is 10-15 mils. The aperture 324 of blind via 306 has a diameter 310 of 25 mils and a depth 312 of 15 mils selected for optimizing solderability of the pin 302 to the PWB 304. The cladding 320 of blind via 306 has a thickness 322 of 5 mils. The present solution is not limited to the particulars of this example.

Notably, the depth 312 of the via 306 into which the pin 302 is disposed is significantly less than that of conventional connector 200. As noted above, the via 600 which is used for each pin 202 of connector 200 is a through hole with a depth 604. Depth 312 is at least reduced by 50% as compared to depth 604. This via depth reduction is at least partially facilitated by the overall design of a novel via with multiple structural interconnected portions. One of these interconnected portions comprises the blind via 306. Notably, the interconnection between blind via 306 and another structural portion of the novel via is not shown in FIG. 3 for purposes of illustrative simplicity.

Figure 4:
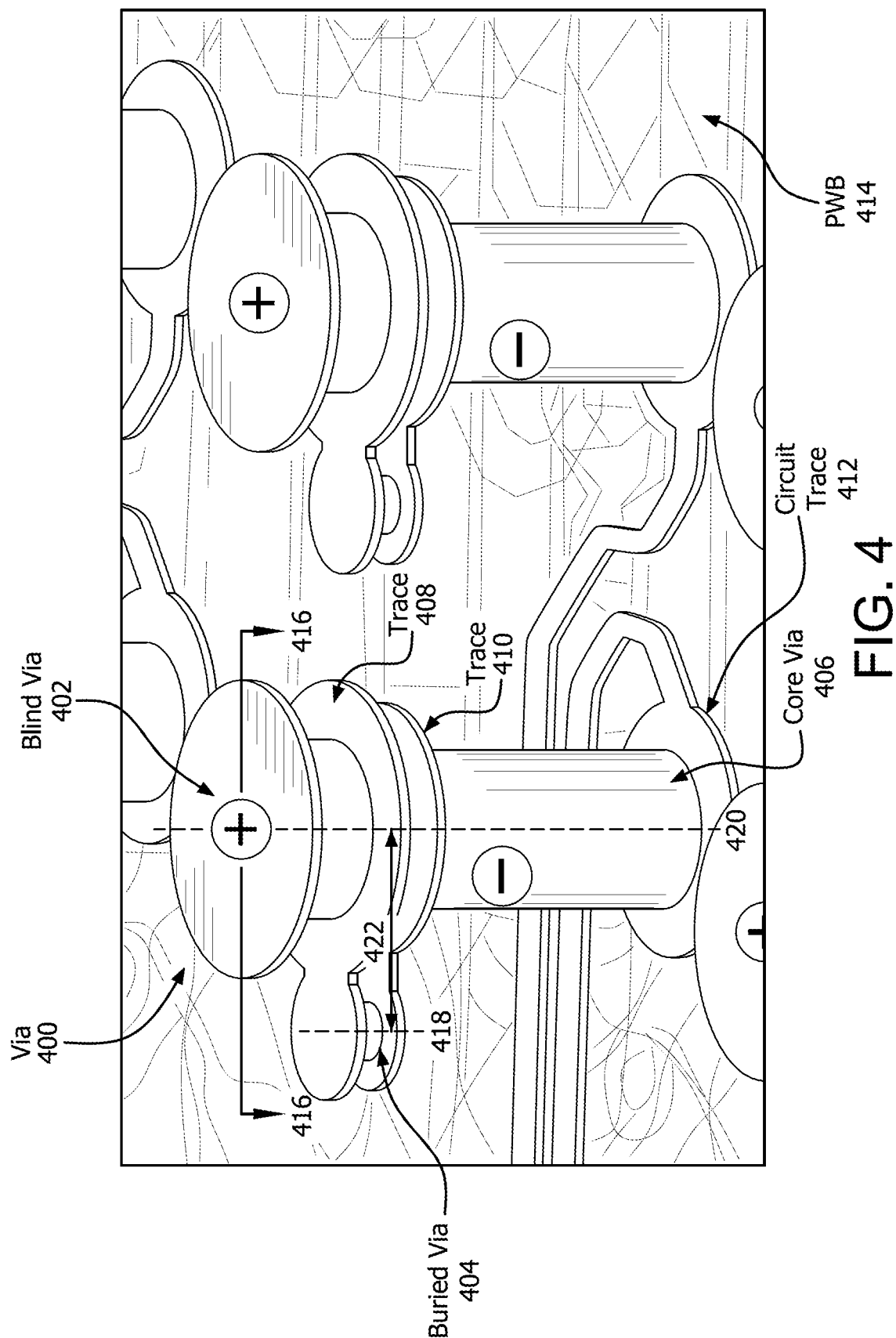
FIG. 4 is an illustration that is useful for understanding a via design in accordance with the present solution.

Referring now to FIG. 4, there is provided a perspective view of an illustrative novel via 400 formed in a PWB 414 in accordance with the present solution. The PWB 414 is formed of a plurality of laminated substrate layers, which are not shown in FIG. 4 for illustrative simplicity. The via 400 is provided to connect a pin of a connector (e.g., pin 302 of FIG. 3) to a circuit trace 412 formed on an internal substrate layer of the PWB 414.

As shown in FIG. 4, via 400 comprises a blind via 402, a buried via 404 and a core via 406. Blind via 306 of FIG. 3 corresponds to blind via 402. Blind via 402 can be same as or similar to blind via 306. As such, the discussion provided above in relation to blind via 306 is sufficient for understanding blind via 402. Blind via 402 is the via into which the connector pin is inserted and solder interfaced with the PWB 414. A cross-sectional view of the via 400 taken along line 416-416 is provided in FIG. 5.

Figure 5:
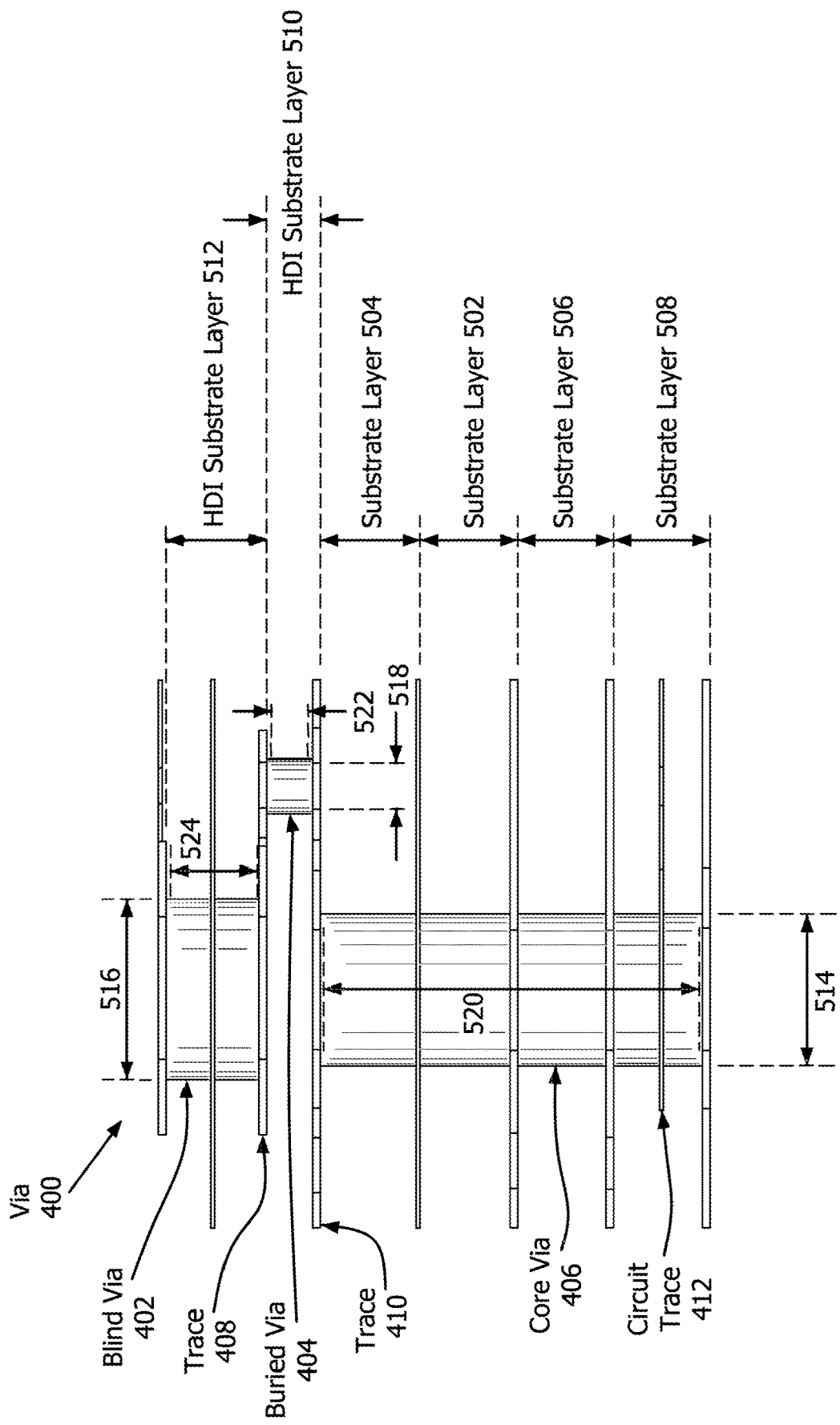
FIG. 5 is a cross-sectional view of a via taken along lines 416-416 of FIG. 4.

As shown in FIGS. 4-5, blind via 402 is electrically connected to buried via 404 by way of trace 408. Buried via 404 is electrically connected to core via 406 by way of trace 410. Blind via 402 and core via 406 have central axis 420 which are aligned with each other. However, core via 406 has a smaller diameter 514 as compared to the diameter 516 of blind via 402. Core via 406 is vertically spaced apart from blind via 402 by a distance. This diameter difference and vertical spacing facilitates the reduction in cross talk interference because a parasitic capacitance between interconnection pairs is minimized.

Buried via 404 has a smaller diameter 518 and depth 522 as compared to those 516/524, 514/520 of blind via 402 and core via 406. In some scenarios, the depth 522 of buried via 404 is between 3-6 mils. The present solution is not limited in this regard. The depth 522 is selected based on a given application. The smaller the depth 522 the less reflections and cross talk. The central axis 418 of buried via is horizontally offset from the central axis 420 of vias 402, 406. The distance 422 between central axis 418 and central axis 420 is selected so that the buried via 404 does not overlap any portion of buried via 404 and/or core via 406. The offset arrangement and reduced sizing of buried via 404 also facilitates the reduction in cross talk interference.

Also, the length 520 of core via 406 is variable and depends on the particulars of a given application. For example, in the scenarios shown in FIGS. 4-5, length 520 is defined by the thickness of substrate layers 502, 504, 506, 510 through which the core via 406 passes. The present solution is not limited in this regard. The PWB can include more or less substrate layers than that shown in FIG. 5. Accordingly, the length 520 of core via 406 can be shorter or longer than that shown in FIGS. 4-5.

Referring now to FIG. 7, illustrations are provided to show how the present solution may be fabricated. In some scenarios, 3-5 lamination cycles are needed to fabricate the present solution, which is less than that required to fabricate a conventional VPX connectors. The present solution is not limited in this regard. The number of lamination cycles needed to form the present solution is dependent on a given application.

In all cases, HDI technology is used to create substrate layers 510 and 512. HDI technology is well known in the art, and therefore will not be described herein. Any known or to be known HDI technology can be used herein without limitation. HDI technology allows for higher circuit density than traditional circuit boards, and improved Radio Frequency ("RF") performance.

Referring now to FIG. 7A-7H, a first lamination cycle is performed to create a laminated core dielectric substrate 708. A second lamination cycle is performed in FIGS. 7I-7N, and a third lamination cycle is performed in FIGS. 7O-7R. Additional lamination cycles can be performed to add more substrate layers in accordance with a particular application.

Figure 7A:
FIGS. 7A-7R (collectively referred to as "FIG. 7") provide illustrations that are useful for understanding how the present solution is fabricated.
Figure 7B:
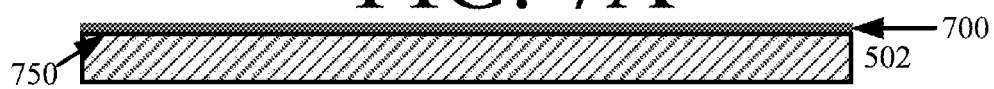

As shown by FIGS. 7A-7G, the core dielectric substrate 708 is formed by laminating a plurality of substrate layers 502-508 together. The lamination process involves acquiring a first substrate layer 502 as in FIG. 7A. The first substrate layer 502 comprises a planar sheet of dielectric material. The dielectric material includes, but is not limited to, a plastic. A first bonding agent 700 is disposed on a first surface 750 of the substrate layer 502, as shown in FIG. 7B. Bonding agents are well known in the art, and therefore will not be described herein. The bonding agent can include, but is not limited to, an adhesive (e.g., glue).

Figure 7C:
Figure 7D:
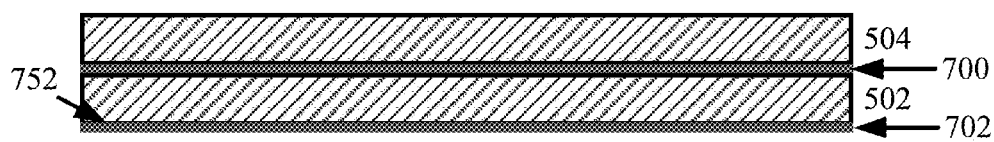

Next in FIG. 7C, a second substrate layer 504 is disposed on top of the bonding agent 700. The second substrate layer 504 comprises a planar sheet of dielectric material. The dielectric material can be the same as or different than that of the first substrate layer 502. In FIG. 7D, a bonding agent 702 is disposed on a second surface 752 of the first substrate layer 502. The bonding agent 702 used here is the same as or different than the bonding agent 700 used in FIG. 7B.

Figure 7E:
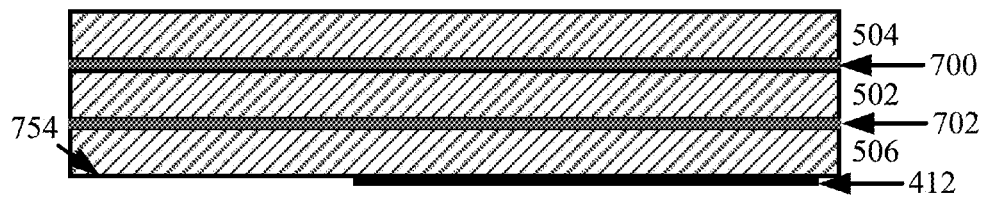
Figure 7F:
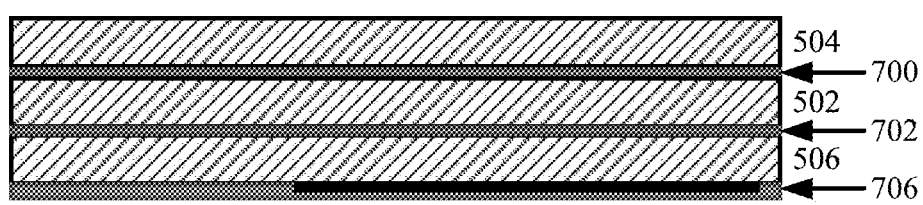

A third substrate layer 506 is then placed on the bonding agent 702 as shown in FIG. 7E. The third substrate layer 506 comprises a planar sheet of dielectric material. The dielectric material can be the same as or different than that of the first substrate layer 502 and/or the second substrate layer 504. A trace 412 is formed on an exposed surface 754 of the third substrate 506, as also shown in FIG. 7E. In FIG. 7F, a bonding agent 706 is then disposed on the exposed surface 754 of the third substrate 506 and trace 412. The bonding agent 706 used here is the same as or different than the bonding agent 700 used in FIG. 7B and/or the bonding agent 702 used in FIG. 7D.

Figure 7G:
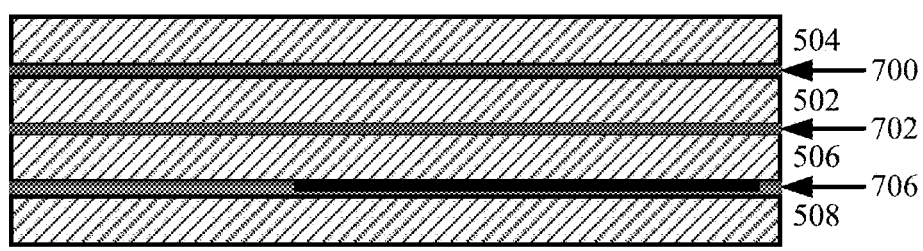
Figure 7H:
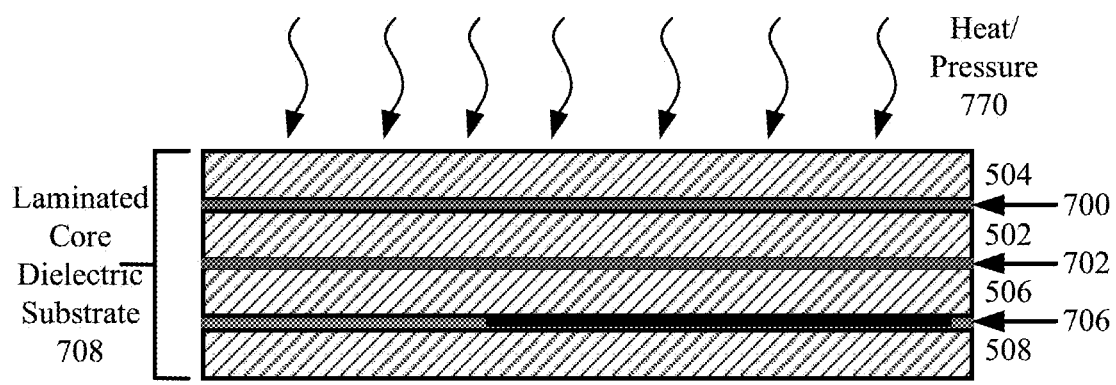

A fourth substrate layer 508 is placed adjacent to the bonding agent 706, as shown in FIG. 7G. The fourth substrate layer 508 comprises a planar sheet of dielectric material. The dielectric material can be the same as or different than that of the other substrate layers 502-506. Subsequently, heat and pressure is applied to the stack of substrate layers for a given period of time as shown by arrows 770 in FIG. 7H. As a consequence, the laminated core dielectric substrate 708 is formed.

Figure 7I:
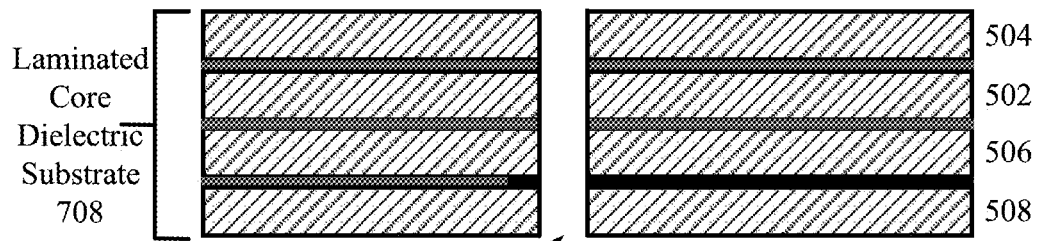
Figure 7J:
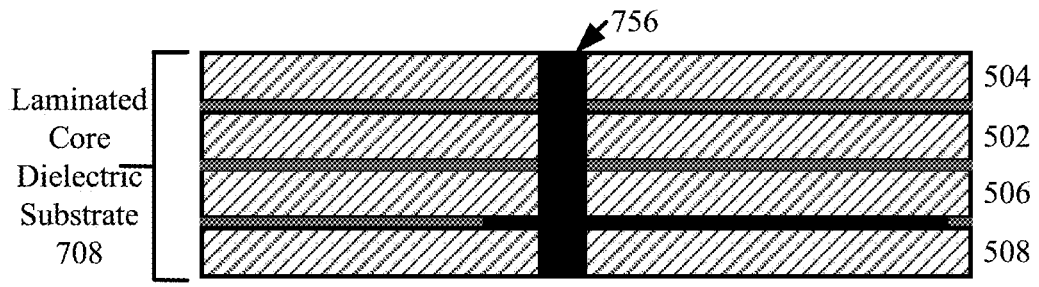

Once the laminated core dielectric substrate 708 is formed, a hole 710 is drilled through substrate layers 502-508 in FIG. 7I. The hole is then filled with an electrically conductive material 756 so as to form the core via 406, as shown in FIG. 7J. The electrically conductive material can include, but is not limited to, copper. Plating may also be performed in FIG. 7J.

Figure 7K:
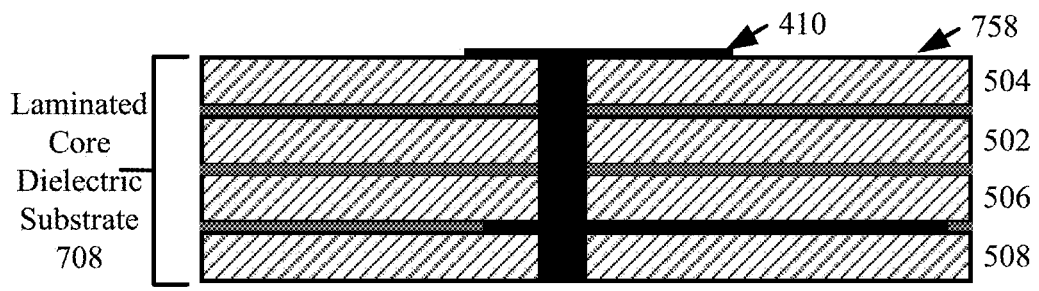

Next in FIG. 7K, trace 410 is formed on an exposed surface 758 of substrate layer 504. An electrically conductive material (e.g., copper) is used to form trace 410. A bonding agent 716 is then disposed on the trace 410 and the exposed surface 758 of substrate layer 504, as shown in FIG. 7L. The bonding agent used here is the same as or different than the bonding agent used in FIG. 7B, FIG. 7D and/or FIG. 7F.

A first HDI substrate layer 510 is placed adjacent to the bonding agent 716 in FIG. 7M. The first HDI substrate layer 510 is formed using an HDI process. HDI processes are well known in the art, and therefore will not be described herein. Notably, the first HDI substrate layer 510 has a via 718 formed therein with an electrically conductive cladding. The electrically conductive cladding can comprise the same or different electrically conductive material (e.g., copper) used to form core via 406 and/or trace 410. Via 718 can include, but is not limited to, a micro-via drilled through an HDI substrate using a laser. The via 718 is located in the first HDI substrate layer 510 so that the trace 410 provides an electrical connection between the via 718 and the core via 406. Heat and pressure is applied to the stack during a second lamination process as shown by arrows 772 of FIG. 7N.

Figure 7P:
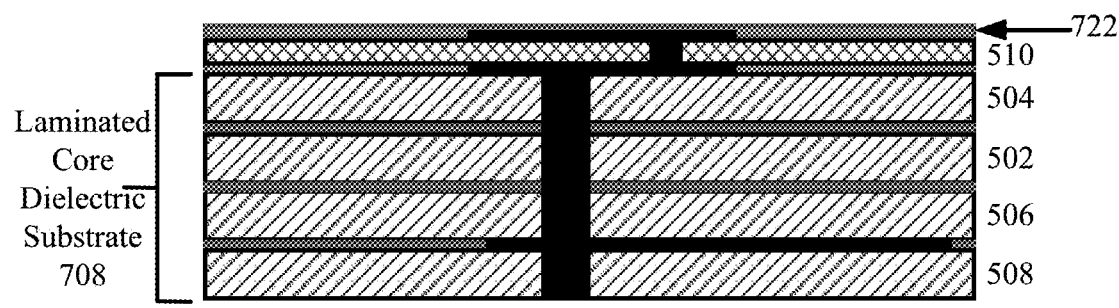

In FIG. 7O, trace 408 is formed on an exposed surface 760 of HDI substrate layer 510. An electrically conductive material (e.g., copper) is used to form trace 408. A bonding agent 722 is then disposed on the trace 408 and the exposed surface 760 of substrate layer 510, as shown in FIG. 7P. The bonding agent used here is the same as or different than the bonding agent used in FIG. 7B, FIG. 7D, FIG. 7F and/or FIG. 7L.

Figure 7Q:
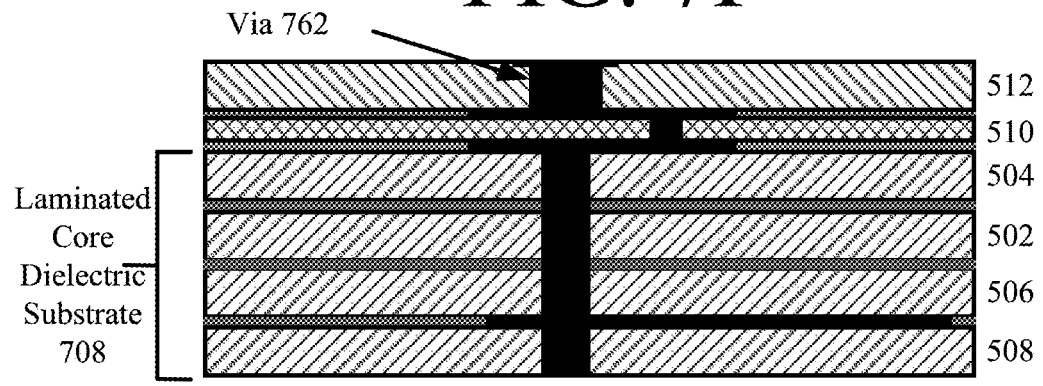

A second HDI substrate layer 512 is placed adjacent to the bonding agent 722 in FIG. 7Q. The second HDI substrate layer 512 is formed using an HDI process. HDI processes are well known in the art, and therefore will not be described herein. Notably, the second HDI substrate layer 512 has a via 762 formed therein with an electrically conductive cladding. The electrically conductive cladding can comprise the same or different electrically conductive material (e.g., copper) used to form core via 406, trace 410, trace 408, and/or via 718. Via 762 can include, but is not limited to, a via drilled through an HDI substrate using a laser. The via 762 is located in the second HDI substrate layer 512 so that the trace 408 provides an electrical connection between the via 762 and the via 718. Heat and pressure is applied to the stack during a third lamination process as shown by arrows 774 of FIG. 7R. As a result of the third lamination process, a laminated substrate 764 is created comprising a core via 406, a buried via 404 and a blind via 402 with traces 408, 410 electronically connecting the same to each other.

As evident from the above description, the present solution combines a connector and PWB architecture into a system that is VITA48 compliant and has capacity to support high speed +25 Gbps data rates at low BER of <1E-15. The connector has short pins that can be soldered into a structured blind via that is fabricated to securely hold the connector to survive the temperature, shock and vibrations of an avionics environment. The blind via is combined with a buried via to form a DT via. The DT via minimizes cross talk by reducing the parasitic capacitance between adjacent DT vias.

Figure 8:
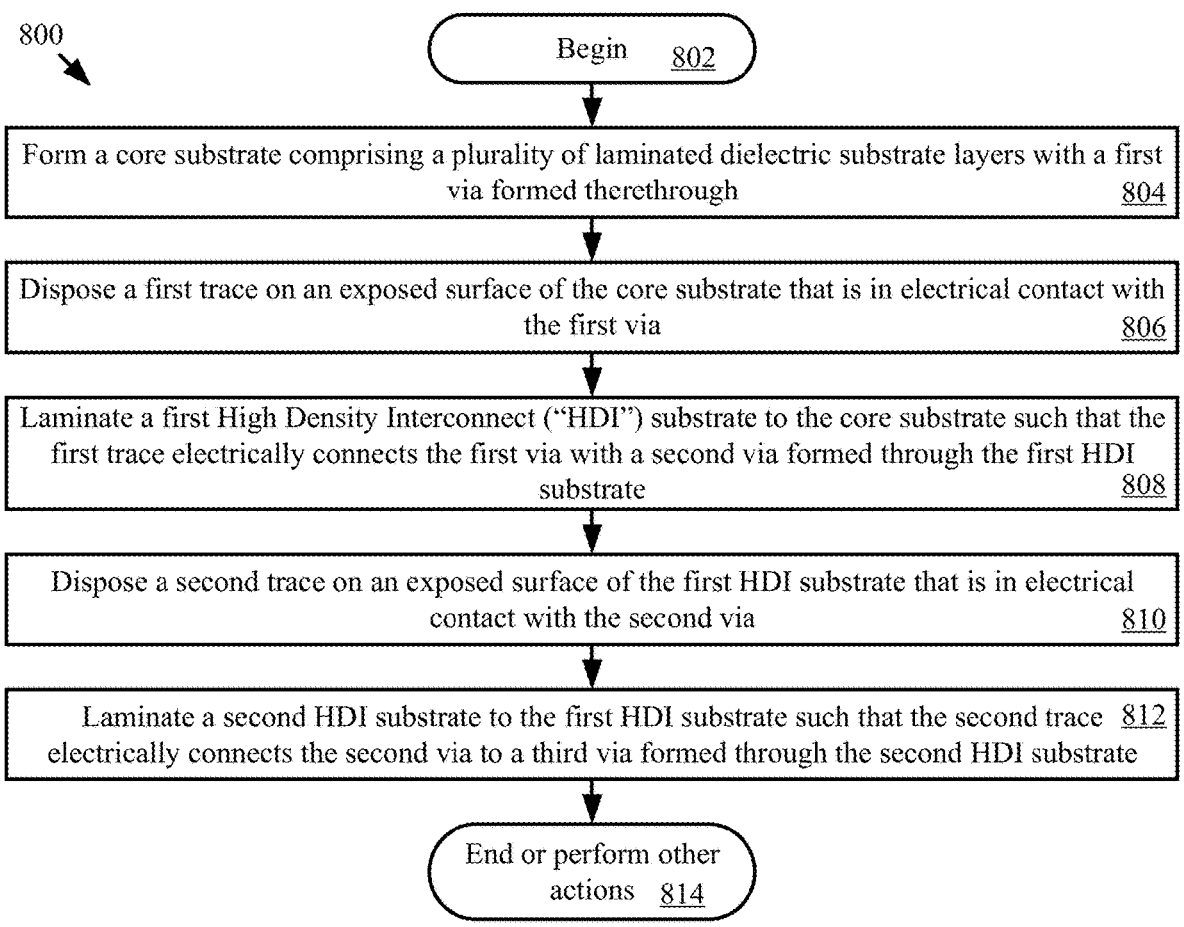
FIG. 8 is a flow diagram of an illustrative method for making a PWB in accordance with the present solution.

Referring now to FIG. 8, there is provided a flow diagram of an illustrative method 800 for making a PWB in accordance with the present solution. The PWB is designed to reduce cross talk associated with a high speed electrical connector. The PWB and the high speed electrical connector collectively support high speed +25 Gbps data rates at low bit error rate of <1E-15.

Method 800 begins with 802 and continues with 804 where a core substrate (e.g., core substrate 708 of FIG. 7) is formed. The core substrate comprises a plurality of laminated dielectric substrate layers (e.g., dielectric layers 502-508 of FIGS. 5 and 7) with a first via (e.g., core via 406 of FIGS. 4-7) formed therethrough. In 806, a first trace (e.g., trace 410 of FIGS. 4-7) is disposed on an exposed surface (e.g., surface 758 of FIG. 7K) of the core substrate that is in electrical contact with the first via. In 808, a first HDI substrate (e.g., HDI substrate layer 510 of FIGS. 5 and 7) is laminated to the core substrate such that the first trace electrically connects the first via with a second via (e.g., via 404 of FIG. 4 and/or 718 of FIG. 7M) formed through the first HDI substrate. In 810, a second trace (e.g., trace 408 of FIGS. 4-7) is disposed on an exposed surface (e.g., surface 760 of FIG. 7O) of the first HDI substrate that is in electrical contact with the second via. In 812, a second HDI substrate (e.g., HDI substrate layer 512 of FIGS. 5 and 7) is laminated to the first HDI substrate such that the second trace electrically connects the second via to a third via formed through the second HDI substrate. Subsequently 814 is performed where method 800 ends or other actions are taken.

In some scenarios, the second via comprises a buried via with a central axis spatially offset (e.g., horizontally offset) from central axis of the first and third vias. The first and second vias having diameters which are smaller than a diameter of the third via. The central axis of the first via is aligned with the central axis of the third via (e.g., a blind via). The diameter of the second via (e.g., a micro-via) is smaller than the diameter of the first via.

Additionally or alternatively, the depth of the third via is selected to provide optimized solderability between the PWB and a pin of the high speed electrical connector. For example, the depth of the third via is 15 mils, the pin has a length between 25-30 mils, and/or a distance between the PWB and the high speed electrical connector when the pin is soldered in the third via is between 10-15 mils. The present solution is not limited to the particulars of this example.

Conventionally, the overall size of a conventional press-fit connector 200 has been restricted because of (i) difficulties in manufacturing the same in large formats and (ii) inaccuracies/tolerances of a corresponding pin field on the PWB. Thus traditionally, a plurality of connectors 200 have been required to accommodate pin fields with more vias than the total number of pins of a connector 200. In order to reduce an overall size of the PWB, the PWB may be fabricated to include vias that are located relatively close together. This small spacing between the adjacent vias requires the manual placement of the conventional press-fit connectors 200 to the PWB, so as to prevent damage to the connectors, traces, vias and/or PWB due to automated machine misalignment issues. Such manual processes are time consuming and costly. The present solution provides a way to automate this process for disposing a plurality of connectors onto a PWB with a relatively dense pin field. The manner in which this process is automated will become evident as the discussion progresses.

Figure 7R:
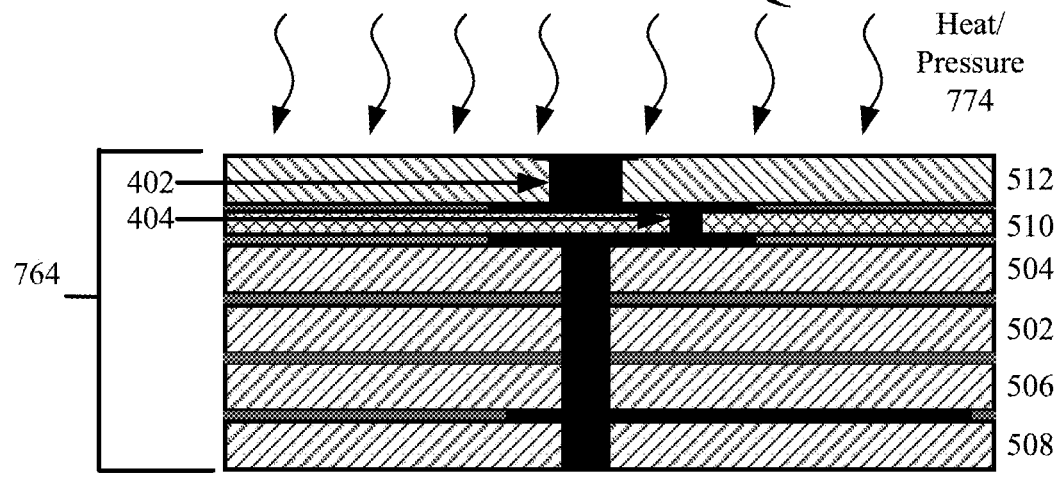
Figure 9:
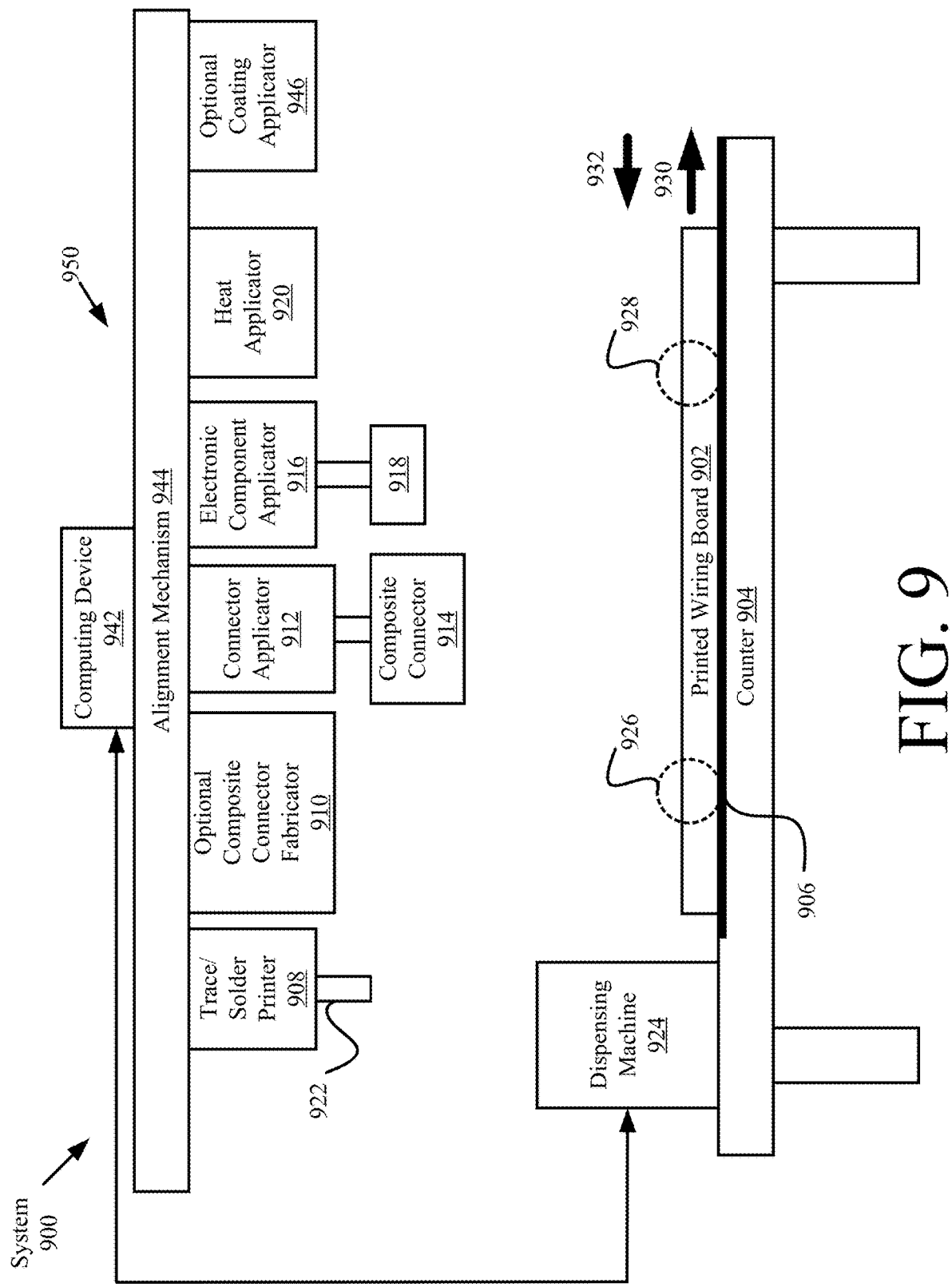
FIG. 9 provides an illustration of an illustrative system for coupling a composite electrical connector to a PWB.

Referring now to FIG. 9, there is provided an illustration of an illustrative system 900 for coupling electronic components to a PWB 902 (e.g., PWB 304 of FIG. 3, PWB 414 of FIG. 4 and/or laminated substrate 764 of FIG. 7R). The electronic components can include, but are not limited to, chips, dies, chiplets, and connectors (e.g., high speed electrical connector 300 of FIG. 3).

As shown in FIG. 9, system 900 comprises a counter 904 on which the PWB 902 can be placed or otherwise disposed. The counter 904 may have a conveyer belt 906 or other means disposed thereon for mechanically moving the PWB in direction 930 and/or direction 932. A dispensing machine 924 may be provided to dispense PWB s on the counter 904 and/or conveyer belt 906. Such dispensing machines are well known. Any known or to be known PWB dispensing machine can be used here.

During a manufacturing process, a computing device 942 controls the dispensing machine 924 to dispense PWB 902. The conveyer belt 906 then causes the PWB 902 to be moved in direction 930 by a certain amount. The conveyer belt 906 may also be controlled by the computing device 942. In some scenarios, the PWB 902 is moved in direction 930 and/or opposing direction 932 so as to align a given portion 926, 928 of the PWB 902 with given components 908, 910, 912, 916, 920 of a manufacturing system 950 at different times during the manufacturing process. In other scenarios, the manufacturing system 950 comprises an alignment mechanism 944 that moves the components 908, 910, 912, 916, 920 relative to the given portion 926, 928 of the PWB 902 during the manufacturing process. The alignment mechanism 944 can include, but is not limited to, motor(s), gear(s), track(s), and/or articulating arm(s). The alignment mechanism 944 is also controlled by the computing device 942. The PWB 902 may have at least one alignment marking that can be used to guide the computing device 942 for properly aligning the component(s) 908, 910, 912, 916, 920 with the given portion 926, 928 thereof. The alignment markings can include, but are not limited to, shape(s) or line(s) printed on the textile substrate, created by, and/or formed using color die(s).

Next, a trace printer 908 is used to dispose one or more conductive traces and/or conductive pads on the PWB 902. Trace printers are well known in the art. In some scenarios, the trace printer comprises an ink jet printer configured to dispense conductive ink, whereby traces are printed or otherwise deposited on objects (e.g., PWB 902). An illustration of a conductive trace 1200 and a conductive pad 1204 disposed on the PWB 902 is provided in FIG. 12. FIG. 12 is not drawn to scale.

The printer 110 may also form at least one alignment marking 1202 on the PWB 902 that can be subsequently used to guide proper placement of electronic components on the PWB. The alignment markings can include, but are not limited to, dot(s), shape(s) or line(s) printed on the PWB.

Thereafter, the printer 110 disposes a solder paste in via(s) and/or conductive pad(s) of the PWB 902. Solder paste printers are well known in the art. Any known or to be known solder paste printer can be used here. An illustration showing solder disposed in a blind via 1302 and on a conductive pad 1204 is provided in FIG. 13. FIG. 13 is not drawn to scale.

Figure 15:
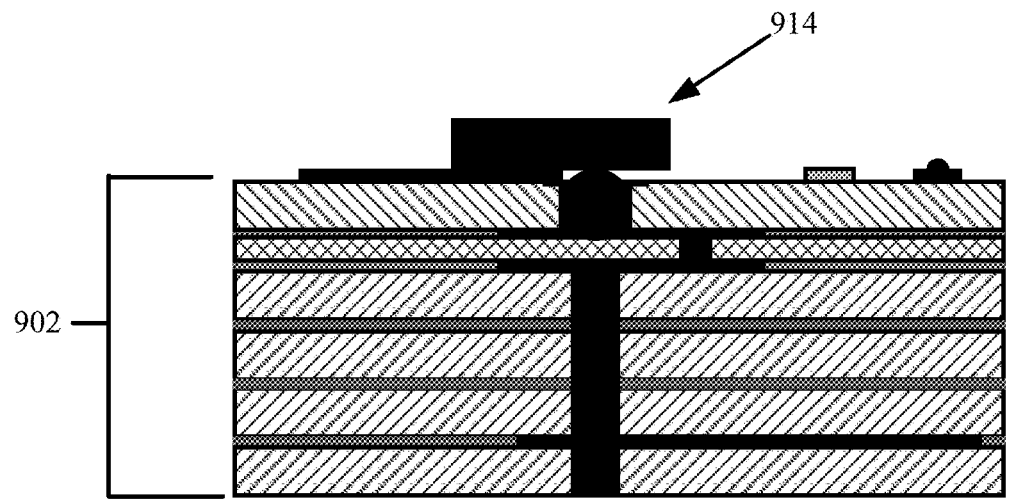

Once the solder has been applied to the PWB, a composite electrical connector 914 is either obtained by a connector applicator 912 of the manufacturing system 950 or optionally created by a composite electrical connector fabricator 910 of the manufacturing system 950. The manner in which a composite electrical connector is created will become more evident as the discussion progresses. The composite electrical connector 914 comprises two or more electrical connectors 300 coupled together in a manner that allows a pick-and-place machine of the connector applicator 912 to capture the same (e.g., via a vacuum or suction cup). The pins of the composite electrical connector 914 are then aligned with the vias of the PWB 902. An illustration showing a composite electrical connector 914 with a pin 1402 aligned with a blind via 1302 of the PWB 902 is provided in FIG. 14. FIG. 14 is not drawn to scale. The composite electrical connector 914 is then lowered onto the PWB by the connector applicator 912. An illustration showing the composite electrical connector 914 disposed on the PWB 902 is provided in FIG. 15. FIG. 15 is not drawn to scale.

Figure 16:
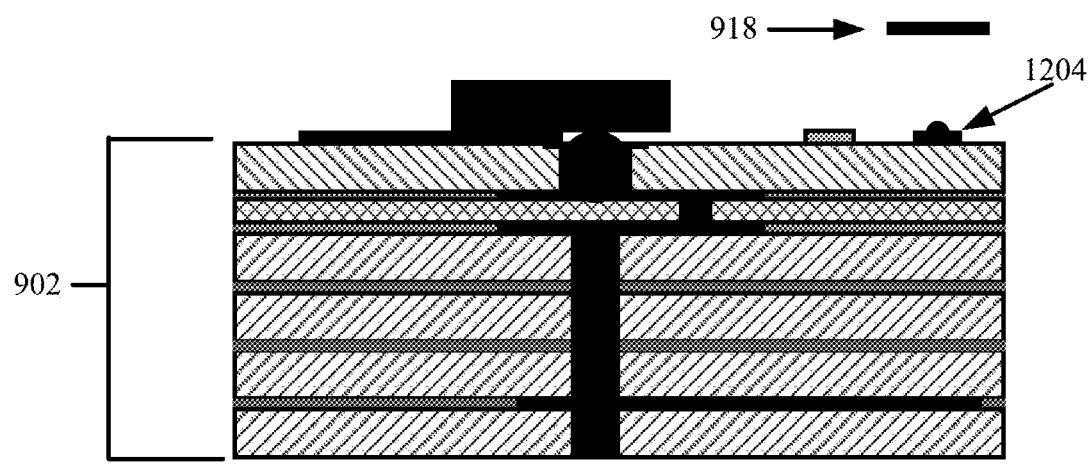
Figure 17:
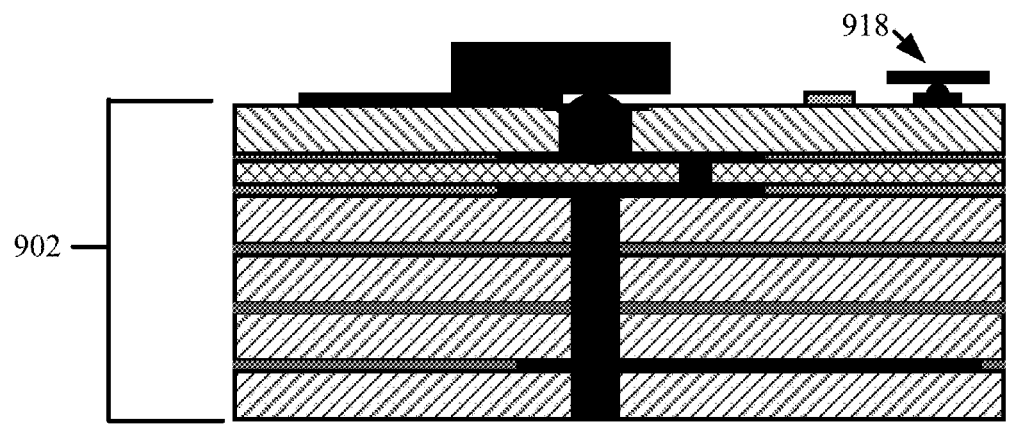

An electronic component applicator 916 then aligns an electronic component 918 (e.g., a chip/die) with a conductive pad formed on the PWB 902. The electronic component can include, but is not limited to, integrated circuits, chips, dies, power sources (e.g., batteries, energy harvesters), capacitors, resistors, inductors, diodes, and/or transistors. An illustration showing the electronic component 918 aligned with the conductive pad 1204 is provided in FIG. 16. FIG. 16 is not drawn to scale. The electronic component 918 is then lowered onto the PWB by the electronic component applicator 916. An illustration showing the electronic component 918 disposed on the PWB 902 is provided in FIG. 17. FIG. 17 is not drawn to scale.

After the composite electrical connector 914 and/or electronic component 918 is disposed on the PWB 902, a heat applicator 920 applies heat to the assembly. The solder is allowed to cure so that the composite electrical connector 914 and/or electronic component 918 is(are) soldered to the board. The PWB 902 may then be coated with a fluid resistive material by a coating applicator 946.

Figure 10:
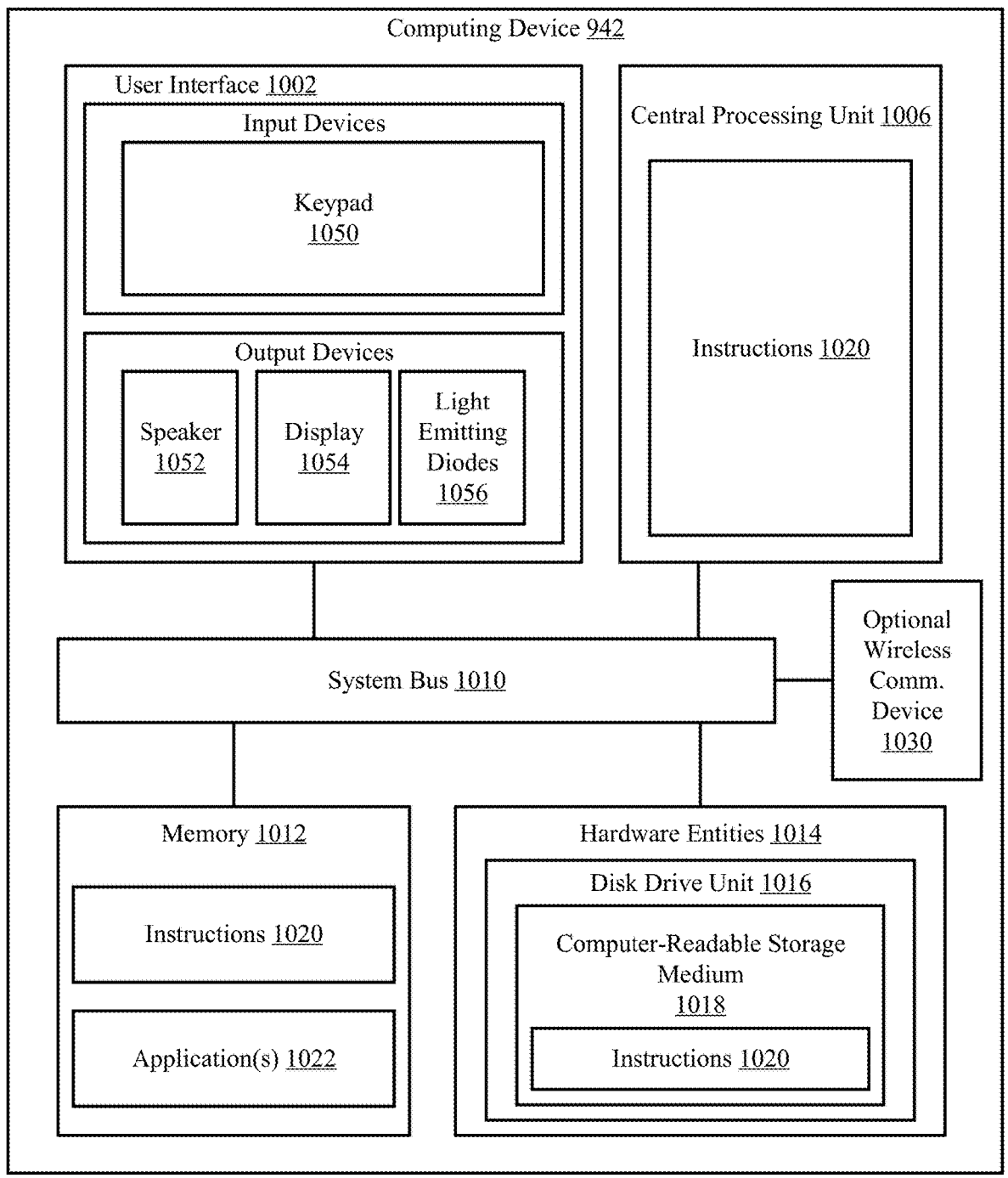
FIG. 10 provides a block diagram of an illustrative architecture for the computing device shown in FIG. 9.

Referring now to FIG. 10, there is provided a detailed block diagram of an illustrative architecture for computing device 942. Computing device 942 may include more or less components than those shown in FIG. 10. However, the components shown are sufficient to disclose an illustrative embodiment implementing the present solution. The hardware architecture of FIG. 10 represents one embodiment of a representative computing device configured to facilitate fabrication of textile substrate based electronic devices As such, the computing device 942 of FIG. 10 implements at least a portion of a method for coupling electronic components (e.g., composite electrical connector 914 of FIG. 9 and/or electronic component 918 of FIG. 9) to a PWB 902 (e.g., PWB 304 of FIG. 3, PWB 414 of FIG. 4 and/or laminated substrate 764 of FIG. 7R) in accordance with the present solution.

Some or all the components of the computing device 942 can be implemented as hardware, software and/or a combination of hardware and software. The hardware includes, but is not limited to, one or more electronic circuits. The electronic circuits can include, but are not limited to, passive components (e.g., resistors and capacitors) and/or active components (e.g., amplifiers and/or microprocessors). The passive and/or active components can be adapted to, arranged to and/or programmed to perform one or more of the methodologies, procedures, or functions described herein.

As shown in FIG. 10, the computing device 942 comprises a user interface 1002, a CPU 1006, a system bus 1010, a memory 1012 connected to and accessible by other portions of computing device 942 through system bus 1010, and hardware entities 1014 connected to system bus 210. The user interface can include input devices (e.g., a keypad 1050) and output devices (e.g., speaker 1052, a display 1054, and/or light emitting diodes 1056), which facilitate user-software interactions for controlling operations of the computing device 942.

At least some of the hardware entities 1014 perform actions involving access to and use of memory 1012, which can be a RAM, a disk drive and/or a Compact Disc Read Only Memory ("CD-ROM"). Hardware entities 1014 can include a disk drive unit 1016 comprising a computer-readable storage medium 1018 on which is stored one or more sets of instructions 1020 (e.g., software code) configured to implement one or more of the methodologies, procedures, or functions described herein. The instructions 1020 can also reside, completely or at least partially, within the memory 1012 and/or within the CPU 1006 during execution thereof by the computing device 942. The memory 1012 and the CPU 1006 also can constitute machine-readable media. The term "machine-readable media", as used here, refers to a single medium or multiple media (e.g., a centralized or distributed database, and/or associated caches and servers) that store the one or more sets of instructions 1020. The term "machine-readable media", as used here, also refers to any medium that is capable of storing, encoding or carrying a set of instructions 1020 for execution by the computing device 942 and that cause the computing device 942 to perform any one or more of the methodologies of the present disclosure.

In some scenarios, the hardware entities 1014 include an electronic circuit (e.g., a processor) programmed for facilitating coupling of electronic components to PWBs. In this regard, it should be understood that the electronic circuit can access and run a software application 1022 installed on the computing device 942. The software application 1022 is generally operative to facilitate control of the trace/solder printer 908, the composite electrical connector fabricator 910, the connector applicator 912, the chip/die applicator 916, the heat applicator 920, and/or the coating applicator 946. Other functions of the software application 1022 will become apparent as the discussion progresses.

Figure 11:
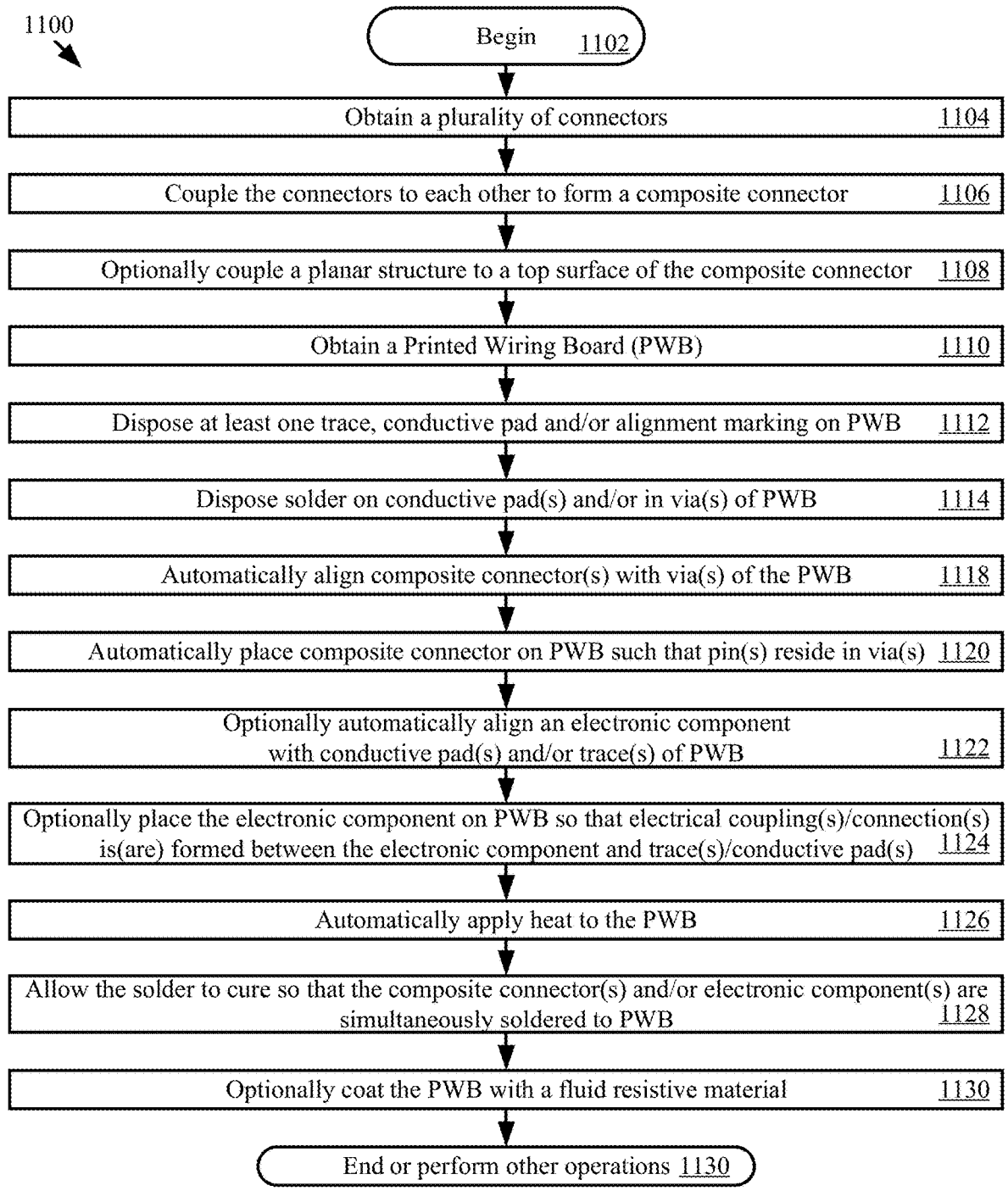
FIG. 11 provides a flow diagram for coupling composite electrical connector(s) and/or other electronic component(s) to a PWB.

Referring now to FIG. 11, there is provided an illustrative method 1000 for coupling electronic components to a PWB. Method 1100 begins with 1102 and continues with 1104 where a plurality of connectors are obtained. Each of the connectors can be the same as or similar to connector 300 of FIG. 3. In some scenarios, the connectors have the same number of pins. In other scenarios, at least one connector has a different number of pins than the other connector(s).

The connectors are then coupled to each other to form a composite electrical connector (e.g., composite electrical connector 914 of FIG. 9), as shown by 1106. The manner in which the composite electrical connector is formed will become evident as the discussion progresses. Generally, the composite electrical connector may be formed using weld(s), adhesive(s), band(s), bar(s), post(s), protrusion(s), aperture(s), cap(s), screw(s) and/or other mechanical couplers.

A planar structure may be coupled to a top surface of the composite electrical connector, as shown by 1108. The planar structure may be employed when the top surface of the composite electrical connector is rough, coarse, textured and/or uneven such that a pick-and-place machine is unable to capture the composite electrical connector (e.g., via a vacuum or suction cup). The planar structure can include, but is not limited to, a plate, a piece of tape, and/or a top surface of a cap.

In 1110, a PWB is obtained. The PWB can include, but is not limited to, PWB 902 of FIG. 9. At least one trace, conductive pad and/or alignment marking is disposed on the PWB in 1112. An illustration showing a trace 1200, alignment marking 1202 and conductive pad 1204 disposed on the PWB 902 is provided in FIG. 12. In 1114, solder is disposed on the conductive pad(s) and/or via(s) of the PWB. An illustration is provided in FIG. 13 that shows solder 1300 disposed on trace 1200 and solder 1304 disposed on the conductive pad 1204.

In 1118, composite electrical connector(s) is(are) automatically aligned with the via(s) of the PWB. Each composite electrical connector can include, but is not limited to, composite electrical connector 914 of FIG. 9. As discussed above, composite electrical connector 914 comprises two or more connectors 300 coupled to each other by a coupling means. The coupling means can include, but is not limited to, weld(s), adhesive(s), band(s), bar(s), post(s), protrusion(s), aperture(s), cap(s), screw(s) and/or other mechanical couplers. An illustration showing the composite electrical connector 914 aligned with a via of the PWB is provided in FIG. 14. Each composite electrical connector is automatically placed on the PWB in 1120 such that the pin(s) (e.g., pin 302 of FIG. 3) reside in the via(s). An illustration showing the composite electrical connector 914 placed on the PWB is provided in FIG. 15.

In some scenarios, other electronic components may be disposed on the PWB. These electronic components can include, but are not limited to, integrated circuits, chips, dies, chiplets, capacitors, resistors, inductors, transformers, diodes, batteries, and/or display screens. Accordingly, method 1100 is shown as comprising optional operations 1122, 1124. 1122 involves optionally automatically aligning an electronic component with conductive pad(s) and/or trace(s) of the PWB. An illustration showing an electronic component 918 aligned with a conductive pad 1204 of the PWB is provided in FIG. 16. 1124 involves optionally placing the electronic component on the PWB so that electrical coupling(s) and/or connection(s) is(are) formed between the electronic component and the trace(s)/conductive pad(s). An illustration showing an electronic component 918 placed on the PWB is provided in FIG. 17.

Next in 1126, heat is applied to the PWB. While heat is being applied, the solder is allowed to cure in 1128. The composite electrical connector(s) and/or electronic component(s) are concurrently and simultaneously soldered to the PWB when the solder cures. The PWB may then be at least partially coated with a fluid resistive material in 1130. Subsequently, method 1100 ends or other processing is performed.

As noted above, a composite electrical connector is either obtained or created by system 900. There are many ways to create a composite electrical connector. Some of the approaches for creating a composite electrical connector will now be described in detail. The present solution is not limited to the composite electrical connector architectures discussed below. The composite electrical connector can have any architecture provided that it (i) includes two or more connectors 300 coupled together and (ii) is able to be captured by a pick-and-place machine (e.g., via a vacuum or suction cup).

Figure 18:
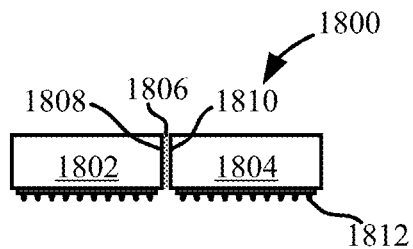
FIGS. 18-33 provide illustrations of a plurality of composite electrical connectors.

Referring now to FIG. 18, there is provided an illustration of an illustrative composite electrical connector 1800. Composite electrical connector 1800 comprises two connectors 1802, 1804 coupled to each other via a bonding agent 1806. The connectors 1802, 1804 are the same as or similar to connector 300 of FIG. 3. Thus, the discussion provided above in relation to connector 300 is sufficient for understanding connectors 1802, 1804. The connectors 1802, 1804 each comprise seventy pins as shown in the bottom view of FIG. 19. The present solution is not limited in this regard. The connectors can include any number of pins having any arrangement selected in accordance with a given application. The bonding agent 1806 can include, but is not limited to, an adhesive (e.g., an insulating epoxy), tape or a weld. If the bonding agent 1806 is an adhesive, then the bonding agent is disposed on the abutting surfaces 1808, 1810 of the connectors 1802, 1804. The present solution is not limited in this regard. In other scenarios, the bonding agent 1806 is not disposed on the abutting surfaces 1808, 1810, but rather along one or more exposed sidewalls 1902, 1904, 1906, 1908 of the connectors.

Figure 19:
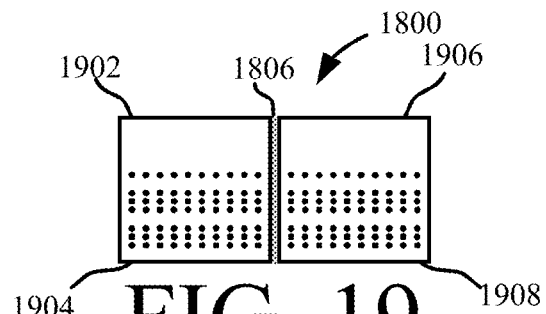
Figure 20:
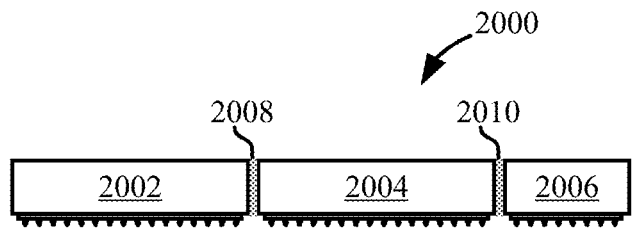
Figure 21:
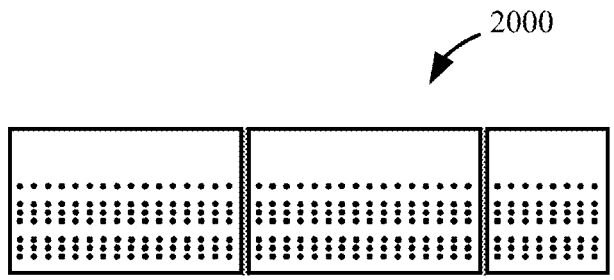

The present solution is not limited to the composite electrical connector architecture shown in FIGS. 18-19. In this regard, it should be understood that the composite electrical connector can include any number of coupled connectors selected in accordance with a given application. The connectors can have the same or different number of pins, and/or the same or different pin arrangements. For example, as shown in FIGS. 20-21, a composite electrical connector 2000 comprises three connectors 2002, 2004, 2006 that are bonded together via bonding agents 2008, 2014. Connectors 2002 and 2004 are the same as each other, while connector 2006 is different than connectors 2002 and 2004. Connector 2006 has a smaller total number of pins and a smaller overall size as compared to that of connectors 2002 and 2004. The pins of the connector 2006 are the same as the pins of connectors 2002, 2004. The pins can include, but are not limited to, pin 302 of FIG. 3. The pins on each connector 2002, 2004, 2006 are arranged in a grid pattern (i.e., rows and columns), as shown in the bottom view of FIG. 21. The present solution is not limited to the particulars of this example.

Figure 22:
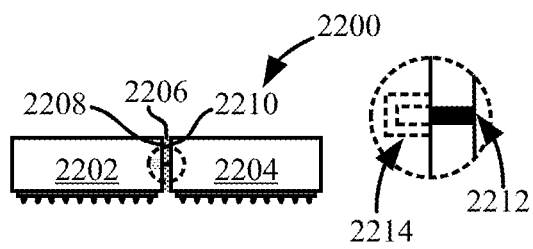
Figure 23:
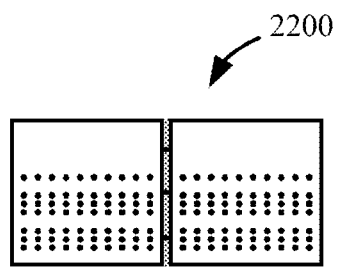

As shown in FIGS. 22-23, a composite electrical connector 2200 comprises two connectors 2202, 2204 coupled to each other with one or more protrusions 2212. Connectors 2202, 2204 are the same as or similar to connector 300 of FIG. 3. Thus, the discussion provided above in relation to connector 300 is sufficient for understanding connectors 2202, 2204. Although two connectors are shown in FIGS. 22-23, the present solution is not limited in this regard. The composite electrical connector can comprise any number of connectors (greater than two) selected in accordance with a given application. Also, two or more of the connectors can have the same or different total number of pins, and/or the same or different pin arrangement (e.g., a grid arrangement, a concentric circle arrangement, an horizontally offset pin arrangement, etc.).

The protrusions 2212 can include, but are not limited to, posts or convex structures. Each protrusion 2212 extends out and away from a sidewall 2210 of connector 2204, and is inserted into an aperture 2214 formed in a sidewall 2208 of connector 2202. The aperture 2214 can have any shape and size suitable to receive a protrusion 2212. For example, the aperture can have a circular cross-sectional profile when the protrusion comprises a circular post, or comprises a concave dimple when the protrusion comprises a convex structure. A frictional engagement or an interference fit may be provided between the protrusion 2212 and the aperture 2214.

An adhesive 2206 may be used in conjunction with the protrusions 2212 to facilitate coupling of the connectors together. The adhesive 2206 may be disposed in aperture(s) 2214 and/or on abutting surfaces 2208, 2210.

Figure 24:
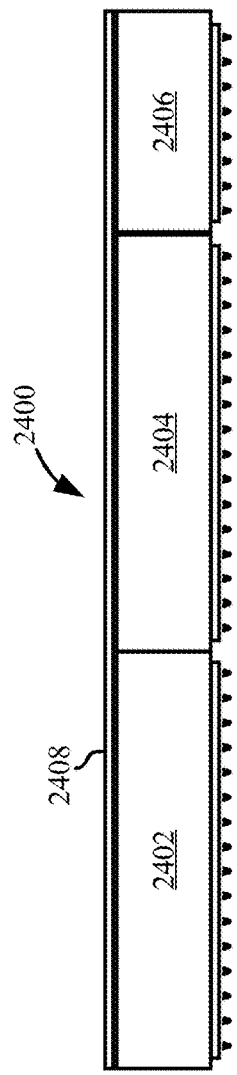
Figure 25:
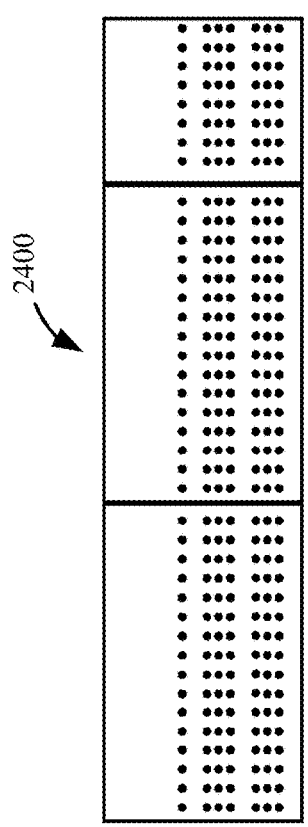
Figure 26:
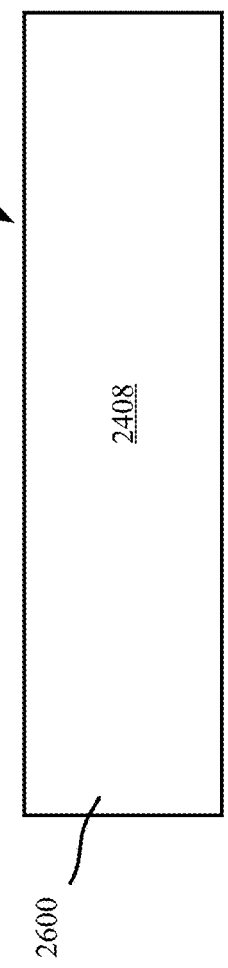

As shown in FIGS. 24-26, a composite electrical connector 2400 comprises three connectors 2402, 2404, 2406 connected to each other. Connectors 2402, 2404, 2406 are the same as or similar to connector 300 of FIG. 3. Thus, the discussion provided above in relation to connector 300 is sufficient for understanding connectors 2402, 2404, 2406. Although three connectors are shown in FIGS. 24-26, the present solution is not limited in this regard. The composite electrical connector can comprise any number of connectors (greater than two) selected in accordance with a given applications. Also, two or more of the connectors can have the same or different total number of pins, and/or the same or different pin arrangement (e.g., a grid arrangement, a concentric circle arrangement, an horizontally offset pin arrangement, etc.).

The connectors 2402, 2404, 2406 are coupled to each other using a cover 2408. The cover 2408 is formed of a rigid or semi-rigid dielectric material (e.g., plastic). The cover 2408 comprises a planar plate with a smooth surface 2600 so that a pick-and-place machine is able to capture the composite electrical connector 2400 (e.g., via a vacuum or suction cup). The cover 2408 is coupled to the connectors 2402, 2404, 2406 via a bonding agent (e.g., an adhesive, weld or tape).

Figure 27:
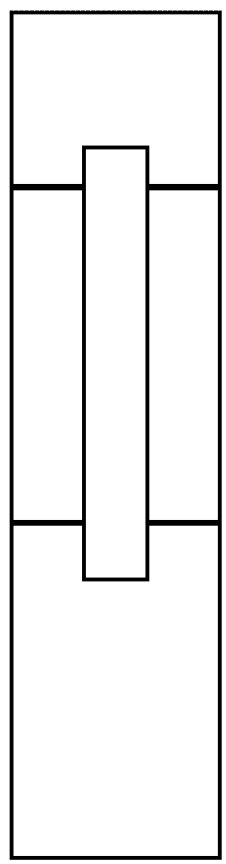

The cover 2408 is sized and shaped to extend the entire collective length and width of the connectors 2402, 2404, 2406, as shown by the top view of FIG. 26. The present solution is not limited in this regard. For example, as shown in FIG. 27, the cover may alternatively have a length less than the collective length of the connectors and/or a width less than the collective width of the connectors. The cover 2408 may be used alone or in conjunction with the bonding agent 1806 of FIGS. 18-19, the bonding agents 2208, 2010 of FIGS. 20-21, and/or the protrusions 2212 of FIGS. 22-23.

Figure 28:
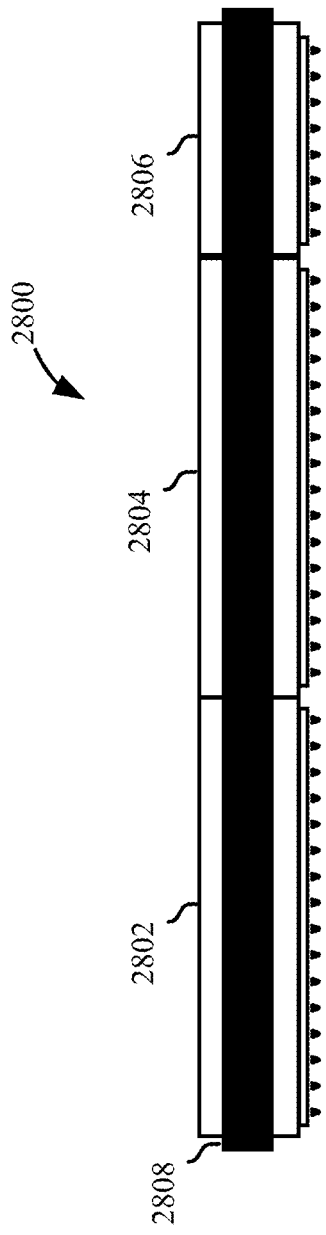
Figure 29:
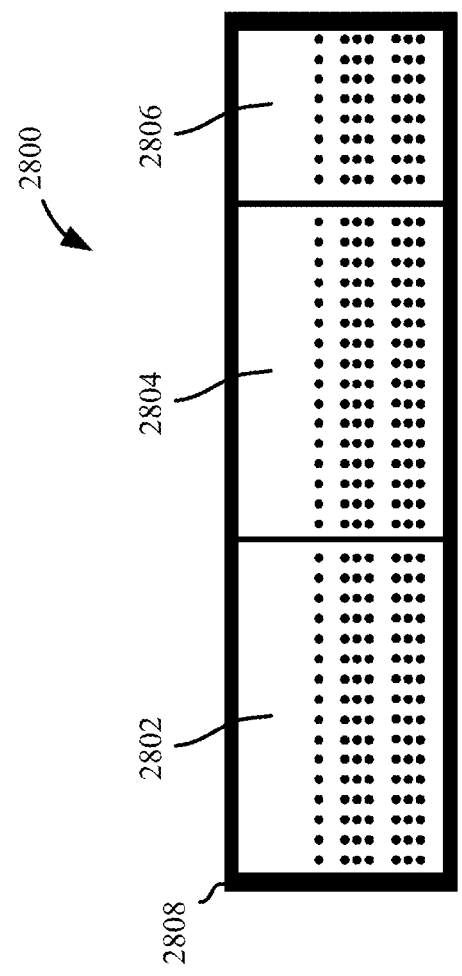

As shown in FIGS. 28-29, a composite electrical connector 2800 comprises a plurality of connectors 2802, 2804, 2806 connected to each other. Connectors 2802, 2804, 2806 are the same as or similar to connector 300 of FIG. 3. Thus, the discussion provided above in relation to connector 300 is sufficient for understanding connectors 2802, 2804, 2806. Although three connectors are shown in FIGS. 18-29, the present solution is not limited in this regard. The composite electrical connector can comprise any number of connectors (greater than two) selected in accordance with a given application. Also, two or more of the connectors can have the same or different total number of pins, and/or the same or different pin arrangement (e.g., a grid arrangement, a concentric circle arrangement, an horizontally offset pin arrangement, etc.).

The connectors 2802, 2804, 2806 are coupled to each other via a band 2808. Band 2808 is formed of a rigid dielectric material (e.g., plastic). Band 2808 extends around and encompasses the serially arranged connectors 2802, 2804, 2806. Band 2808 may be removably disposed around the connectors or securely coupled to the connectors (e.g., via an adhesive or mechanical couplers (e.g., pin(s) or screw(s)). In both scenarios, the band 2808 may frictionally engage the sidewalls of the connectors 2802, 2804, 2806. A rubber material may be disposed on an inner surface of the band to facilitate the frictional engagement. The band 2808 may be used alone or in conjunction with the bonding agent 1806 of FIGS. 18-19, the bonding agents 2208, 2010 of FIGS. 20-21, the protrusions 2212 of FIGS. 22-23, and/or the cover 2408 of FIGS. 24-26.

Figure 30:
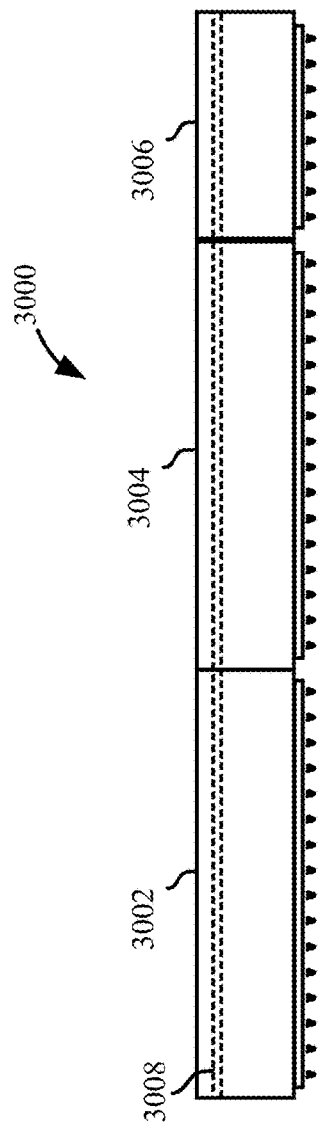
Figure 31:
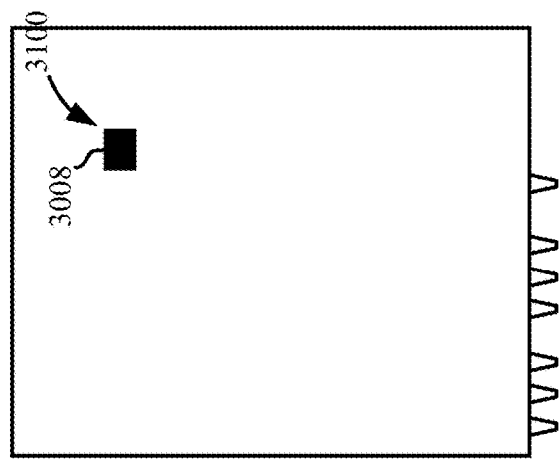

As shown in FIGS. 30-31, a composite electrical connector 3000 comprises a plurality of connectors 3002, 3004, 3006 connected to each other. Connectors 3002, 3004, 3006 are the same as or similar to connector 300 of FIG. 3. Thus, the discussion provided above in relation to connector 300 is sufficient for understanding connectors 3002, 3004, 3006. Although three connectors are shown in FIGS. 30-31, the present solution is not limited in this regard. The composite electrical connector can comprise any number of connectors (greater than two) selected in accordance with a given application. Also, two or more of the connectors can have the same or different total number of pins, and/or the same or different pin arrangement (e.g., a grid arrangement, a concentric circle arrangement, an horizontally offset pin arrangement, etc.).

The connectors 3002, 3004, 3006 are coupled to each other via an elongate shaft or bar 3008 that extends through apertures 3100 formed therein. The shaft or bar 3008 is formed of a rigid material (e.g., metal or plastic). The shaft or bar 3008 may have a frictional engagement or interference fit with the connectors 3002, 3004, 3006. The shaft or bar 3008 can have any shape selected in accordance with a given application. For example, the shaft or bar 3008 has a circular, square, rectangular, oval or half circle cross-sectional profile. The shaft or bar 3008 may be used alone or in conjunction with the bonding agent 1806 of FIGS. 18-19, the bonding agents 2208, 2010 of FIGS. 20-21, the protrusions 2212 of FIGS. 22-23, the cover 2408 of FIGS. 24-26, and/or band 2808 of FIGS. 28-29. In scenarios where the shaft/bar 3008 and band 2808 are both used to couple connectors together, the shaft/bar may optionally be connected to the band (e.g., via an adhesive, weld, and/or a mechanical coupler such as a screw).

Figure 32:
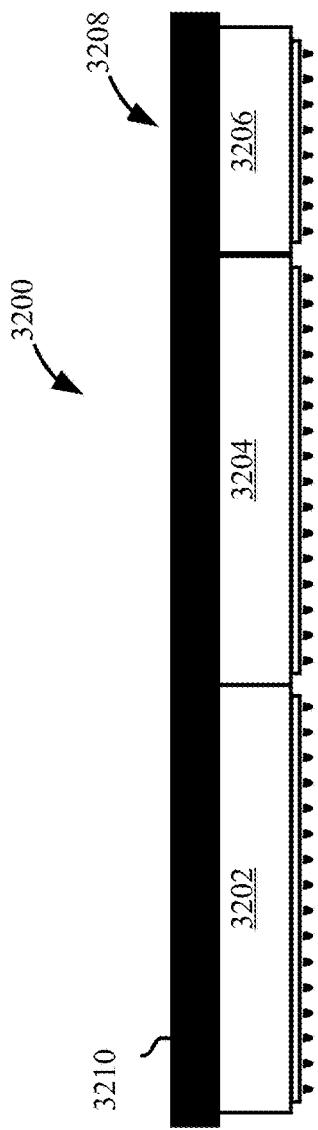
Figure 33:
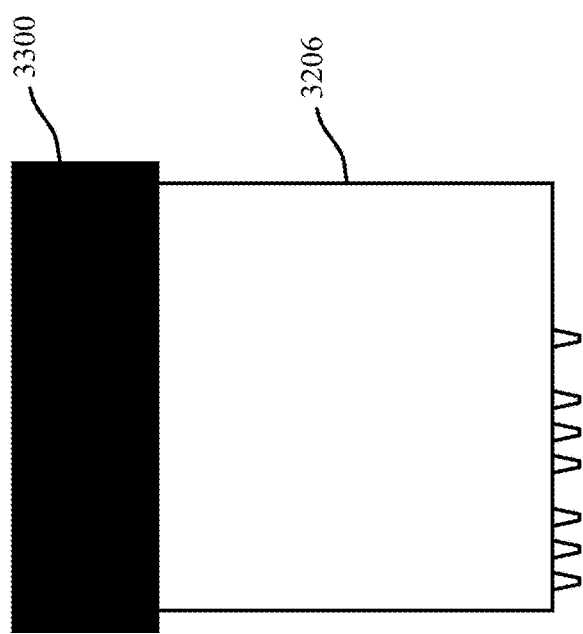

Referring now to FIGS. 32-33, a composite electrical connector 3200 comprises a plurality of connectors 3202, 3204, 3206 connected to each other. Connectors 3202, 3204, 3206 are the same as or similar to connector 300 of FIG. 3. Thus, the discussion provided above in relation to connector 300 is sufficient for understanding connectors 3202, 3204, 3206. Although three connectors are shown in FIGS. 32-33, the present solution is not limited in this regard. The composite electrical connector can comprise any number of connectors (greater than two) selected in accordance with a given application. Also, two or more of the connectors can have the same or different total number of pins, and/or the same or different pin arrangement (e.g., a grid arrangement, a concentric circle arrangement, an horizontally offset pin arrangement, etc.).

The connectors 3202, 3204, 3206 are coupled to each other via a cap 3208. The cap 3208 is formed of a dielectric material (e.g., plastic), has a smooth top surface 3210, and four sidewalls 3300 that extend out from and perpendicular to surface 3210. The cap 3208 may frictionally engage, snapingly engage, and/or clamp the connectors 3202, 3204, 3206.

Figure 34:
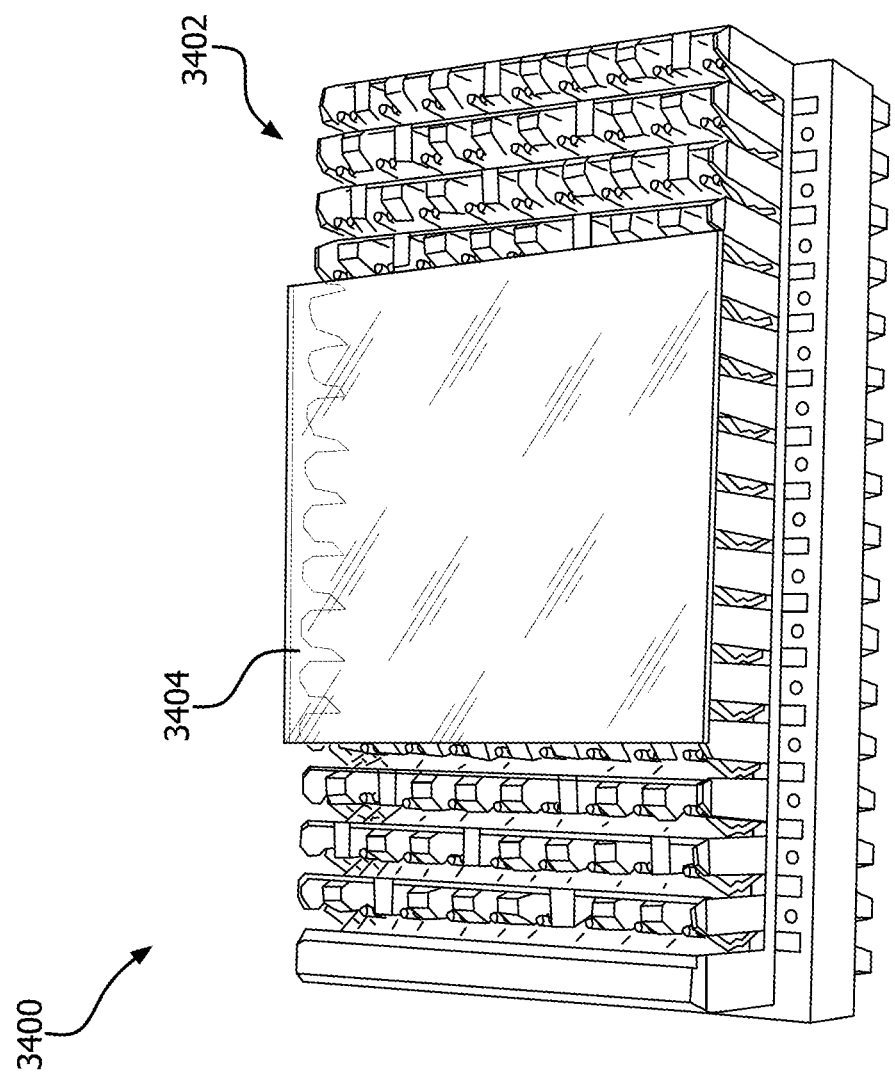
FIG. 34 provides an illustration showing a connector with an augmented placement interface feature.

Referring now to FIG. 34, there is provided an illustration showing a connector 3400 with a rough surface 3400. A pick-and-place machine is unable to capture the connector 3400 via a vacuum or suction cup because of the rough surface. A piece of planar tape 3404 is coupled to the rough surface 3400 to provide a smooth surface which allows the capture of the connector 3400 by the pick-and-place machine.

Figure 35:
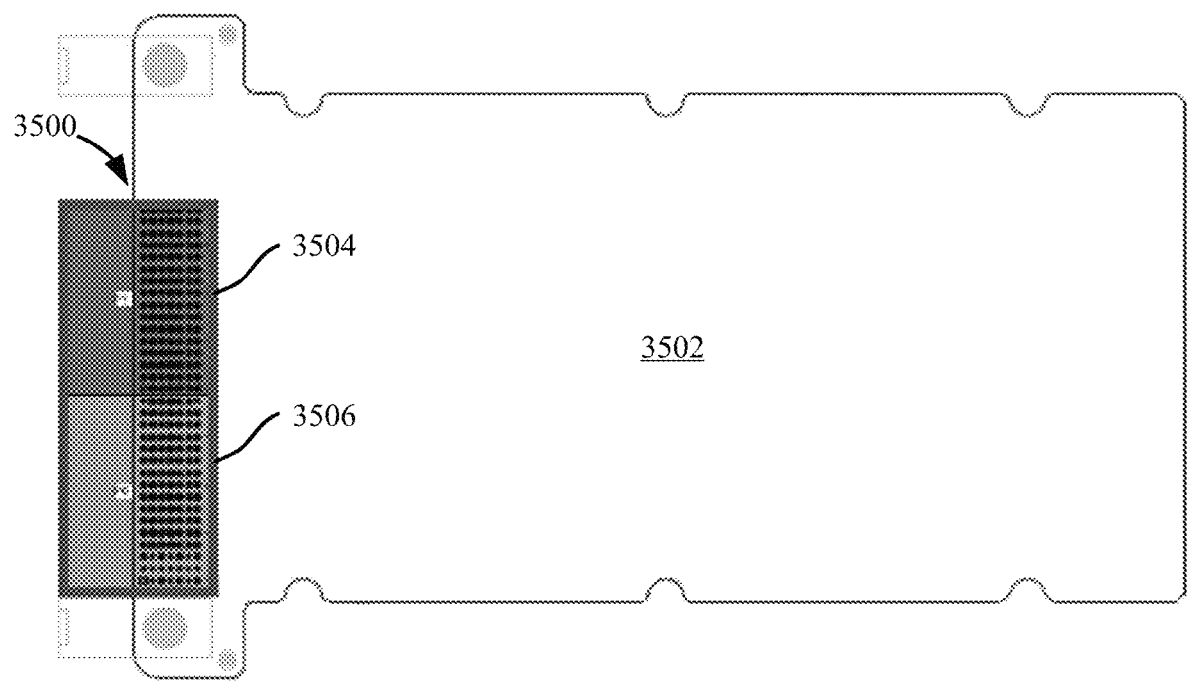
FIGS. 35-37 each provide an illustration showing composite electrical connector(s) coupled to a PWB.

Referring now to FIG. 35, there is provided an illustration of an illustrative composite electrical connector 3500 coupled to a PWB 3502. The composite electrical connector 3500 comprises two connectors 3504, 3506 coupled to each other via an bonding agent. Connectors 3504, 3506 are the same as each other, and/or the same as or similar to connector 300 of FIG. 3. The composite electrical connector 3500 is used as an edge connector in FIG. 35. If separate from each other, the connectors 3504, 3506 would have to be manually placed on the PWB 3502. However, the present solution provides a means to automate this process through creation/use of the composite electrical connector 3500. The composite electrical connector 3500 is able to be automatically captured by a pick-and-place machine, and placed on the PWB 3502 by the pick-and-place machine. The present solution is not limited to the connector and/or PWB architecture shown in FIG. 35.

Figure 36:
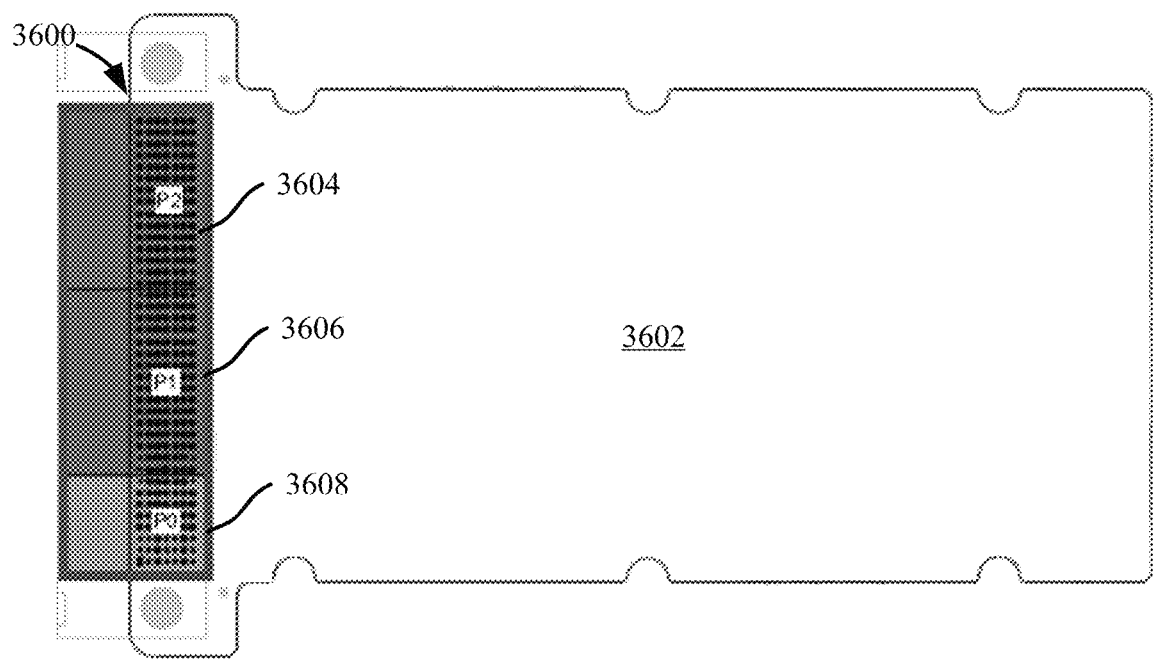

In FIG. 36, another illustrative composite electrical connector 3600 is shown coupled to a PWB 3602. The composite electrical connector 3600 comprises three connectors 3604, 3606, 3608 coupled to each other via an bonding agent. Each of the connectors 3604, 3606, 3608 is the same as or similar to connector 300 of FIG. 3. However, each connector 3604, 3606 has more pins than connector 3608. The composite electrical connector 3600 is used as an edge connector in FIG. 36. If separate from each other, the connectors 3604, 3606, 3608 would have to be manually placed on the PWB 3602. However, the present solution provides a means to automate this process through creation/ use of the composite electrical connector 3600. The composite electrical connector 3600 is able to be automatically captured by a pick-and-place machine, and placed on the PWB 3602 by the pick-and-place machine. The present solution is not limited to the connector and/or PWB architecture shown in FIG. 36.

Figure 37:
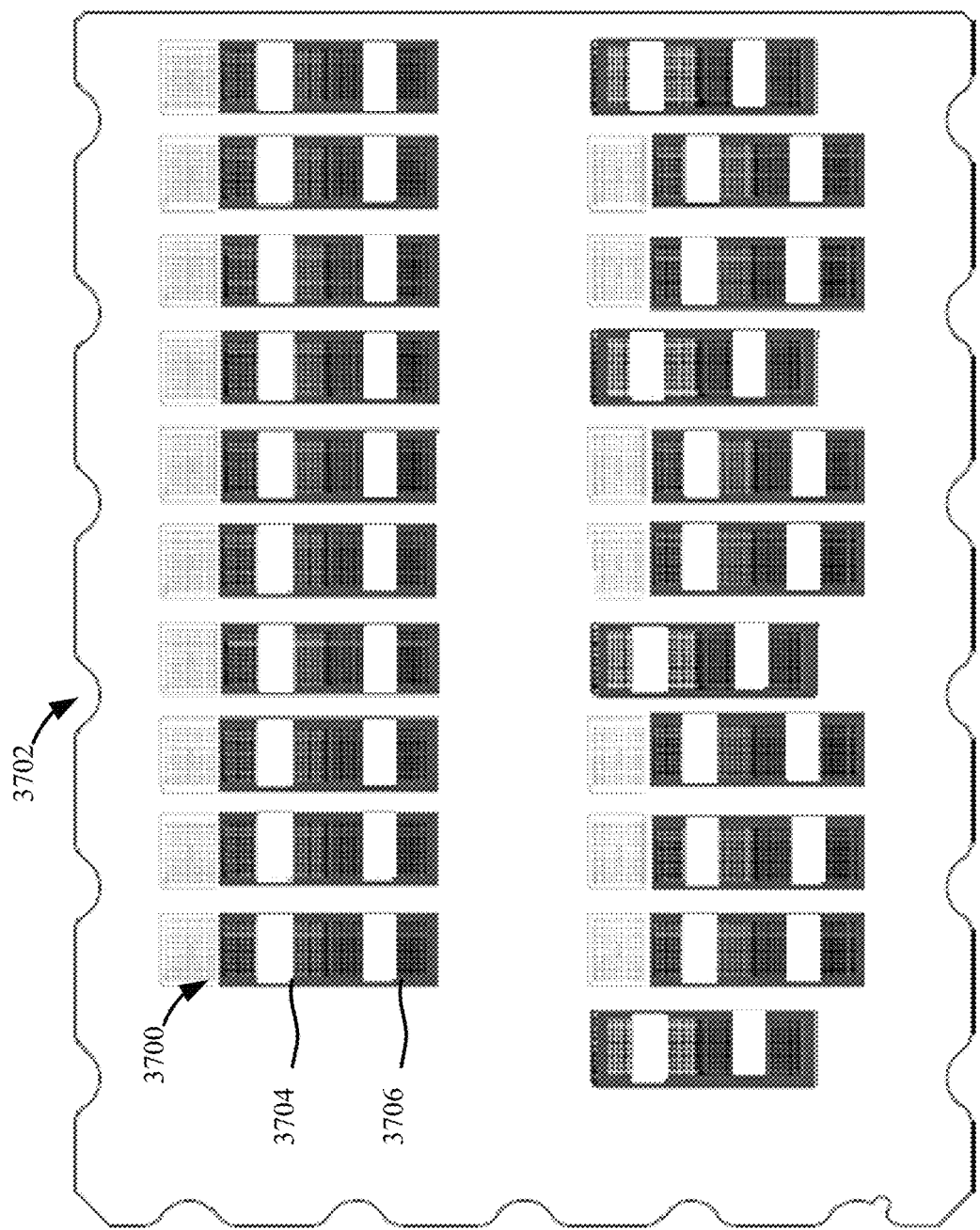

Referring now to FIG. 37, there is provided an illustration of a plurality of composite electrical connectors 3700 coupled to a PWB 3702. Each composite electrical connector 3700 comprises two connectors 3704, 3706 coupled to each other via an bonding agent. Each connector 3704, 3706 is the same as or similar to connector 300 of FIG. 3. If separate from each other, the connectors 3704, 3706 would have to be manually placed on the PWB 3702. However, the present solution provides a means to automate this process through creation/use of the composite electrical connector 3700. The composite electrical connector 3700 is able to be automatically captured by a pick-and-place machine, and placed on the PWB 3702 by the pick-and-place machine. The present solution is not limited to the connector and/or PWB architecture shown in FIG. 37.

The described features, advantages and characteristics disclosed herein may be combined in any suitable manner.

One skilled in the relevant art will recognize, in light of the description herein, that the disclosed systems and/or methods can be practiced without one or more of the specific features. In other instances, additional features and advantages may be recognized in certain scenarios that may not be present in all instances.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Although the systems and methods have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application. Thus, the breadth and scope of the disclosure herein should not be limited by any of the above descriptions. Rather, the scope of the invention should be defined in accordance with the following claims and their equivalents.

We claim:

1. A method for simultaneously coupling a plurality of high speed electrical connectors to a Printed Wiring Board ("PWB"), comprising:
   obtaining a composite electrical connector comprising the plurality of high speed electrical connectors which are serially arranged in a side-by-side manner and coupled to each other;
   automatedly engaging a smooth surface of the composite electrical connector;
   placing the composite electrical connector on the PWB so that pins of the plurality of high speed electrical connectors are concurrently inserted into vias formed in the PWB; and
   coupling the composite electrical connector to the PWB by soldering the pins in the vias.

2. The method according to claim 1, wherein the plurality of high speed electrical connectors are coupled to each other with a weld, an adhesive or tape.

3. The method according to claim 1, wherein at least one connector of the plurality of high speed electrical connectors comprises at least one protrusion inserted into an aperture formed in an adjacent connector of the plurality of high speed electrical connectors.

4. The method according to claim 1, wherein the composite electrical connector comprises a cover that has a planar smooth surface and that couples the plurality of high speed electrical connectors to each other.

5. The method according to claim 4, wherein the cover extends an entire collective length and width of the plurality of high speed electrical connectors.

6. The method according to claim 5, wherein the cover has at least one of (i) a length less than a collective length of the plurality of high speed electrical connectors and (ii) a width less than the collective width of the plurality of high speed electrical connectors.

7. The method according to claim 1, wherein the composite electrical connector comprises a band encompassing the plurality of high speed electrical connectors.

8. The method according to claim 1, wherein the composite electrical connector comprises a bar at least partially inserted into each connector of the plurality of high speed electrical connectors.

9. The method according to claim 1, wherein the composite electrical connector comprises a cap coupled to the plurality of high speed electrical connectors and configured to maintain the plurality of high speed electrical connectors in a side-by-side arrangement.

10. The method according to claim 1, wherein the composite electrical cover comprises a planar element that covers a rough, coarse, textured or uneven top surface of at least one connector of the plurality of high speed electrical connectors.

11. The method according to claim 1, wherein each said via comprises a blind via.

12. The method according to claim 1, wherein at least two connectors of the plurality of high speed electrical connectors have a different number of pins.

13. The method according to claim 1, wherein the pins have lengths between 25-30 mils.

14. The method according to claim 1, wherein each said via is electrically connected to a buried via of the PWB that has a central axis spatially offset from a central axis of said via.

15. A composite electrical connector, comprising:
   a plurality of high speed electrical connectors which are serially arranged in a side-by-side manner;
   a coupling element coupling the plurality of high speed electrical connectors to each other; and
   a smooth surface configured to facilitate an automated placement of the composite electrical connector on a Printed Wiring Board ("PWB") so that pins of the plurality of high speed electrical connectors are concurrently inserted into vias formed in the PWB.

16. The composite electrical connector according to claim 15, wherein the coupling element comprises at least one of a weld, an adhesive and tape.

17. The composite electrical connector according to claim 15, wherein the coupling element comprises at least one protrusion (i) extending from a sidewall of at least one connector of the plurality of high speed electrical connectors and (ii) inserted into at least one aperture formed in a sidewall of an adjacent connector of the plurality of high speed electrical connectors.

18. The composite electrical connector according to claim 15, wherein coupling element comprises a cover that extends an entire collective length and width of the plurality of high speed electrical connectors.

19. The composite electrical connector according to claim 15, wherein coupling element comprises a cover that has at least one of (i) a length less than a collective length of the plurality of high speed electrical connectors and (ii) a width less than the collective width of the plurality of high speed electrical connectors.

20. The composite electrical connector according to claim 15, wherein the coupling element comprises a band encompassing the plurality of high speed electrical connectors.

21. The composite electrical connector according to claim 15, wherein the coupling element comprises a bar at least partially inserted into each connector of the plurality of high speed electrical connectors.

22. The composite electrical connector according to claim 15, wherein the coupling element comprises a cap configured to maintain the plurality of high speed electrical connectors in a side-by-side arrangement.

23. The composite electrical connector according to claim 15, wherein the coupling element comprises a planar element that covers a rough, coarse, textured or uneven top surface of at least one connector of the plurality of high speed electrical connectors.

24. A system, comprising:
- a Printed Wiring Board ("PWB") comprising a substrate in which a plurality of vias are formed; and
- a composite electrical connector coupled to the PWB, comprising
  - a plurality of high speed electrical connectors which are arranged in a side-by-side manner;
  - a coupling element configured to couple the plurality of high speed electrical connectors to each other; and
  - a smooth surface configured to facilitate an automated placement of the composite electrical connector on the PWB;
- wherein pins of the plurality of high speed electrical connectors are concurrently inserted into the vias of the PWB during the automated placement of the composite electrical connector on the PWB.

25. The system according to claim 24, wherein the coupling element comprises at least one of a weld, an adhesive, a piece of tape, a protrusion, a cover, a band, a bar, and a cap.

26. The method according to claim 1, wherein at least two connectors of the plurality of high speed electrical connectors have a different number of pins.

* * * * *